(12) United States Patent
Tsuboi et al.

(10) Patent No.: US 8,018,118 B2
(45) Date of Patent: Sep. 13, 2011

(54) MICRO-OSCILLATION ELEMENT PROVIDED WITH WEIGHT PORTION, AND ARRAY UTILIZING THE SAME

(75) Inventors: Osamu Tsuboi, Kawasaki (JP); Norinao Kouma, Kawasaki (JP); Hiromitsu Soneda, Kawasaki (JP); Hisao Okuda, Kawasaki (JP); Yoshihiro Mizuno, Kawasaki (JP); Tsuyoshi Matsumoto, Kawasaki (JP); Ippei Sawaki, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 326 days.

(21) Appl. No.: 12/145,063

(22) Filed: Jun. 24, 2008

(65) Prior Publication Data

US 2009/0001847 A1   Jan. 1, 2009

(30) Foreign Application Priority Data

Jun. 29, 2007  (JP) ................................ 2007-173078

(51) Int. Cl.
*H02N 1/00* (2006.01)
*G02B 26/08* (2006.01)
(52) U.S. Cl. ...................... 310/309; 359/225.1; 359/290; 359/224.1
(58) Field of Classification Search .................... 310/309
See application file for complete search history.

(56) References Cited

U.S. PATENT DOCUMENTS

| | | | | |
|---|---|---|---|---|
| 5,969,465 A * | 10/1999 | Neukermans et al. | ........ | 310/333 |
| 6,771,850 B1 * | 8/2004 | Greywall | ........................ | 385/17 |
| 7,038,830 B2 * | 5/2006 | Tsuboi et al. | .................. | 359/290 |
| 7,129,617 B2 * | 10/2006 | Hong | .............................. | 310/309 |
| 7,193,492 B2 * | 3/2007 | Greywall et al. | ................ | 335/78 |
| 7,239,774 B1 * | 7/2007 | Stowe et al. | ..................... | 385/19 |
| 7,315,410 B2 * | 1/2008 | Saitoh | ......................... | 359/224.1 |
| 7,439,184 B2 * | 10/2008 | Kouma et al. | .................. | 438/694 |
| 7,453,182 B2 * | 11/2008 | Kouma et al. | .................. | 310/309 |
| 7,893,596 B2 * | 2/2011 | Tsuboi et al. | .................. | 310/309 |
| 2006/0119216 A1 * | 6/2006 | Kouma et al. | .................. | 310/309 |
| 2006/0120425 A1 | 6/2006 | Kouma et al. | | |
| 2008/0175281 A1 * | 7/2008 | Nakamura | ....................... | 372/20 |
| 2009/0001847 A1 * | 1/2009 | Tsuboi et al. | .................. | 310/309 |
| 2010/0007940 A1 * | 1/2010 | Tsuboi et al. | .................. | 359/295 |

(Continued)

FOREIGN PATENT DOCUMENTS

EP       1643290 A1    4/2006

(Continued)

OTHER PUBLICATIONS

Manual Translation of JP 2004-082288, Akihiko Murai et al., "electrostatic actuator and optical switch using the same", Mar. 18, 2004.*

(Continued)

*Primary Examiner* — Karl Tamai
(74) *Attorney, Agent, or Firm* — Westerman, Hattori, Daniels & Adrian, LLP

(57) ABSTRACT

A micro-oscillation element includes a base frame, an oscillating portion, and a link portion connecting the base frame and the oscillating portion to each other. The oscillating portion has a movable functional portion, a first driving electrode connected to the movable functional portion, and a weight portion joined to the first driving electrode. The link portion defines an axis of the oscillating motion of the oscillating portion. The second driving electrode, fixed to the base frame, generates driving force for the oscillating motion in cooperation with the first driving electrode.

11 Claims, 20 Drawing Sheets

U.S. PATENT DOCUMENTS

2010/0067083 A1* 3/2010 Tsuboi et al. .............. 359/221.2
2010/0085623 A1* 4/2010 Matsumoto et al. ....... 359/221.2
2010/0092130 A1* 4/2010 Soneda et al. .................. 385/18

FOREIGN PATENT DOCUMENTS

| EP | 1975674 A2 | 10/2008 |
|---|---|---|
| JP | 2003-19700 A | 1/2003 |
| JP | 2004082288 * | 3/2004 |
| JP | 2004219889 * | 8/2004 |
| JP | 2004-341364 A | 12/2004 |
| JP | 2006-72252 A | 3/2006 |
| JP | 2006-121653 A | 5/2006 |
| KR | 2006-61885 | 6/2006 |

OTHER PUBLICATIONS

Korean Office Action dated Jul. 31, 2009, issued in corresponding Korean Patent Application No. 519980964415.
European Search Report dated Jul. 16, 2010, issued in corresponding European Patent Application No. 08158155.

* cited by examiner

MICRO-OSCILLATION ELEMENT PROVIDED WITH WEIGHT PORTION, AND ARRAY UTILIZING THE SAME

BACKGROUND OF THE INVENTION

1. Field of the Invention

The present invention relates to a micro-oscillation element such as a micromirror, an acceleration sensor, an angular speed sensor and a vibration element. The present invention also relates to an array utilizing such micro-oscillation elements.

2. Description of the Related Art

Recently, elements having a minute structure formed by micromachining technology have been utilized in various technical fields. Examples of such elements include micro-oscillation devices such as a micromirror element, an acceleration sensor and an angular speed sensor, each of which comprises a very small oscillating portion. Micromirror elements are employed for reflecting light in the technical fields of optical disks or optical telecommunications, for example. The acceleration sensor and the angular speed sensor are employed, for example, for stabilizing an image in a digital video camera or a still camera incorporated in a mobile phone against the user's hand motion. These sensors are also employed for a car navigation system, an airbag inflation timing system, or for a posture controlling system of a car or a robot. Conventional micro-oscillation elements are described in JP-A-2003-19700, JP-A-2004-341364 and JP-A-2006-72252, for example.

FIGS. 21 to 23 depict a micro-oscillation element X3, as an example of the conventional micro-oscillation elements. FIG. 21 is a plan view of the micro-oscillation element X3, and FIGS. 22 and 23 are cross-sectional views taken along a line XXII-XXII and a line XXIII-XXIII in FIG. 21, respectively.

The micro-oscillation element X3 includes an oscillating portion 40, a frame 51, a pair of torsion bars 52, and a combtooth electrode 53, and is built up as a micromirror element. For the sake of explicitness of the drawings, the oscillating portion 40 and the frame 51 are hatched in FIG. 21.

The oscillating portion 40 includes a land portion 41, a combtooth electrode 42, and a beam portion 43. The land portion 41 includes on its surface a mirror portion 41a that reflects light. The combtooth electrode 42 serves as a movable electrode in the driving mechanism of the micro-oscillation element X3, and is constituted of a silicon material made conductive. The beam portion 43 connects the land portion 41 and the combtooth electrode 42. The beam portion 43 is constituted of a silicon material made conductive.

The frame 51 has such a shape that surrounds the oscillating portion 40, and is constituted of a silicon material. The frame 51 includes therein a predetermined conductive path (not shown).

The pair of torsion bars 52 defines an axis A3 of the oscillating motion of the oscillating portion 40, or the land portion 41. Each of the torsion bars 52 is connected to the beam portion 43 and the frame 51 of the oscillating portion 40, thereby serving as a link therebetween and, as shown in FIG. 23, is thinner than the beam portion 43 and the frame 51 in a thicknesswise direction H thereof. The torsion bars 52 also serve to electrically connect the conductive path in the frame 51 and the beam portion 43, and are constituted of a silicon material made conductive.

The combtooth electrode 53 serves to generate electrostatic force in cooperation with the combtooth electrode 42, and is fixed to the frame 51 as shown in FIG. 23. In other words, the combtooth electrode 53 constitutes a fixed electrode of the driving mechanism of the micro-oscillation element X3. The combtooth electrode 53 is constituted of a silicon material made conductive. The combtooth electrodes 42, 53 are located at different levels in height from each other as shown in FIGS. 22 and 23, for example when the oscillating portion 40 is not working. The combtooth electrode 42, 53 are also located such that the respective electrode teeth are disaligned from each other, in order to avoid interference when the oscillating portion 40 is driven to oscillate.

In the micro-oscillation element X3, giving a predetermined potential to the combtooth electrodes 42, 53 can rotationally displace the oscillating portion 40, or the land portion 41, about the axis A3. The potential can be given to the combtooth electrode 42 via the predetermined conductive path in the frame 51, the pair of torsion bars 52, and the beam portion 43, and the combtooth electrode 42 is grounded, for example. Upon generating desired static attraction between the combtooth electrodes 42, 53 by giving the predetermined potential to each of the combtooth electrodes 42, 53, the combtooth electrode 42 is attracted toward the combtooth electrode 53. Accordingly, the oscillating portion 40, or the land portion 41, oscillates about the axis A3, and can be rotationally displaced by such an angle that the static attraction between the electrodes and the total torsional resistance of the respective torsion bars 52 are balanced. The amount of the rotational displacement in such oscillating motion is controlled through adjusting the potential to be given to the combtooth electrodes 42, 53. Upon canceling the static attraction between the combtooth electrodes 42, 53, the respective torsion bars 52 restore the natural state, so that the oscillating portion 40, or the land portion 41, assumes the orientation as shown in FIG. 23. Driving thus the oscillating portion 40 or the land portion 41 to oscillate allows changing as desired the direction of light reflected by the mirror portion 41a provided on the land portion 41.

As noted above, the micro-oscillation element X3 drives the oscillating portion 40 to oscillate about the axis A3 defined by the torsion bars 52. Such configuration, however, makes the weight balance of the oscillating portion 40 about the axis A3 rather undesirable. Specifically, as shown in FIG. 21, the upper half of the oscillating portion 40 above the axis A3 in the drawing has a relatively dense structure, while the lower half below the axis A3 has a relatively sparse structure (in other words, the upper and lower halves of the oscillating portion 40 are nonsymmetrical). Further, as shown in FIG. 23, the axis A3 is biased to a lower position in the drawing in a thicknesswise direction H of the oscillating portion 40. Such structure impedes achieving desirable weight balance of the oscillating portion 40 about the axis A3. The poor weight balance of the oscillating portion 40 impedes accurate adjustment of the rotational displacement in the oscillating motion of the oscillating portion 40. For instance, the oscillating portion 40 is prone to slight rotation under the influence of the gravity. In an acceleration sensor or an angular speed sensor, the undesirable weight balance in the oscillating portion is degrading to the sensing characteristics.

SUMMARY OF THE INVENTION

The present invention has been proposed under the circumstances described above. It is therefore an object of the present invention to provide a micro-oscillation element and a micro-oscillation element array that are appropriate for achieving desirable weight balance of the oscillating portion.

A first aspect of the present invention provides a micro-oscillation element comprising a base frame, an oscillating portion, and a link portion connecting the base frame and the oscillating portion to each other. The oscillating portion includes a movable functional portion, a first driving electrode connected to the movable functional portion, and a weight portion joined to the first driving electrode on an opposite side of the movable functional portion. The link portion defines an axis of the oscillating motion of the oscillating portion. The micro-oscillation element also comprises a second driving electrode to generate driving force for the oscillating motion in cooperation with the first driving electrode.

In the oscillating portion of the micro-oscillation element of the present invention, the first driving electrode, having a relatively sparse structure, is arranged between the movable functional portion and the weight portion. The axis of the oscillating motion of such oscillating portion is defined by the link portion connecting the frame and the oscillating portion to each other. Since the weight portion is adjacent to the first driving electrode, a desirable weight balance about the axis is attained in the oscillating portion. Such micro-oscillation element facilitates accurate controlling of the rotational displacement in the oscillating motion of the oscillating portion. Also, in the case where the micro-oscillation element is used in an acceleration sensor or an angular speed sensor, the desirable weight balance of the oscillating portion is advantageous for attaining excellent sensing performance.

The micro-oscillation element of the present invention may be obtained by processing a material substrate having a multilayer structure including a first conductor layer, a second conductor layer, and an insulating layer between the first and the second conductor layer. In this case, the movable functional portion, the first driving electrode, and the weight portion may be portions formed in the first conductor layer, while the second driving electrode may be a portion formed in the second conductor layer.

Preferably, the link portion may be connected to the oscillating portion at a position between the movable functional portion and the first driving electrode. The oscillating portion may include a beam portion for connecting the movable functional portion and the first driving electrode to each other. In this case, the link portion may be connected to the beam portion of the oscillating portion.

Preferably, the weight portion may be electrically connected to the first driving electrode. Such configuration is advantageous for giving a predetermined potential to the weight portion via the first driving electrode.

Preferably, the micro-oscillation element of the present invention may be designed to generate electrostatic force between the weight portion and the second driving electrode. Such structure allows generating electrostatic driving force between the first driving electrode and the second driving electrode, as well as between the weight portion and the second driving electrode. By such double driving force generation, it is easy to cause the oscillating portion to oscillate in a desired manner.

Preferably, the spacing between the weight portion and the second driving electrode gradually increases as proceeding away from the first driving electrode (that is, away from the axis of the oscillating motion). Such configuration facilitates decreasing electrostatic force per unit area generated between the weight portion and the second driving electrode at farther positions from the first driving electrode. This is advantageous for suppressing the momentum to act for bending the first driving electrode (to which the weight portion is joined), and thereby preventing undue deformation of the first driving electrode.

Preferably, the first driving electrode may include first and second arm portions extending in parallel in a direction that intersects with the oscillation axis, and a plurality of electrode teeth extending from the first arm portion toward the second arm portion and spacedly aligned along the extending direction of the first arm portion. The first driving electrode may also include a plurality of electrode teeth extending from the second arm portion toward the first arm portion and spacedly aligned along the extending direction of the second arm portion. In addition, the second driving electrode may include a third arm portion extending along the first and the second arm portion, and a plurality of electrode teeth extending from the third arm portion toward the first arm portion and spacedly aligned along the extending direction of the third arm portion. The second driving electrode may also include a plurality of electrode teeth extending from the third arm portion toward the second arm portion and spacedly aligned along the extending direction of the third arm portion.

Preferably, the oscillating portion may further include an additional weight portion coupled to the first driving electrode between the movable functional portion and the weight portion. The additional weight portion is stacked on the first driving electrode in a thicknesswise direction of the oscillating portion (hence the first driving electrode). Such additional weight portion contributes to achieving desirable weight balance about the axis in the oscillating portion including the movable functional portion, the first driving electrode, and the weight portion (in particular, the desirable weight balance between the structure on one side and the structure on the opposite side of the axis as viewed in the thicknesswise direction of the oscillating portion).

As noted above, the micro-oscillation element of the present invention may be obtained by processing a material substrate having a multilayer structure including a first conductor layer, a second conductor layer, and an insulating layer between the first and the second conductor layer. In this case, the additional weight portion may be portions formed in the second conductor layer.

Preferably, the additional weight portion may be electrically connected to the first driving electrode. Such configuration is advantageous for giving a predetermined potential to the additional weight portion via the first driving electrode.

The micro-oscillation element of the present invention may further include an additional frame, and an additional link portion connecting the base frame and the additional frame to each other, where the additional link portion defines an additional axis extending in a direction that intersects with the axis of the oscillating motion of the base frame. The micro-oscillation element may also include a driving mechanism that generates driving force causing the base frame to oscillate. The micro-oscillation element of the present invention may be configured as such biaxial oscillation element.

A second aspect of the present invention provides a micro-oscillation element array. The micro-oscillation element array includes a plurality of micro-oscillation elements according to the first aspect of the present invention. The axes of the plurality of micro-oscillation elements may be parallel to each other. The first driving electrodes of the respective micro-oscillation elements may be applied with a potential given in common, while the second driving electrodes of the respective micro-oscillation elements may be applied with a potential individually given thereto.

DETAILED DESCRIPTION OF THE PREFERRED EMBODIMENTS

Figure 1:
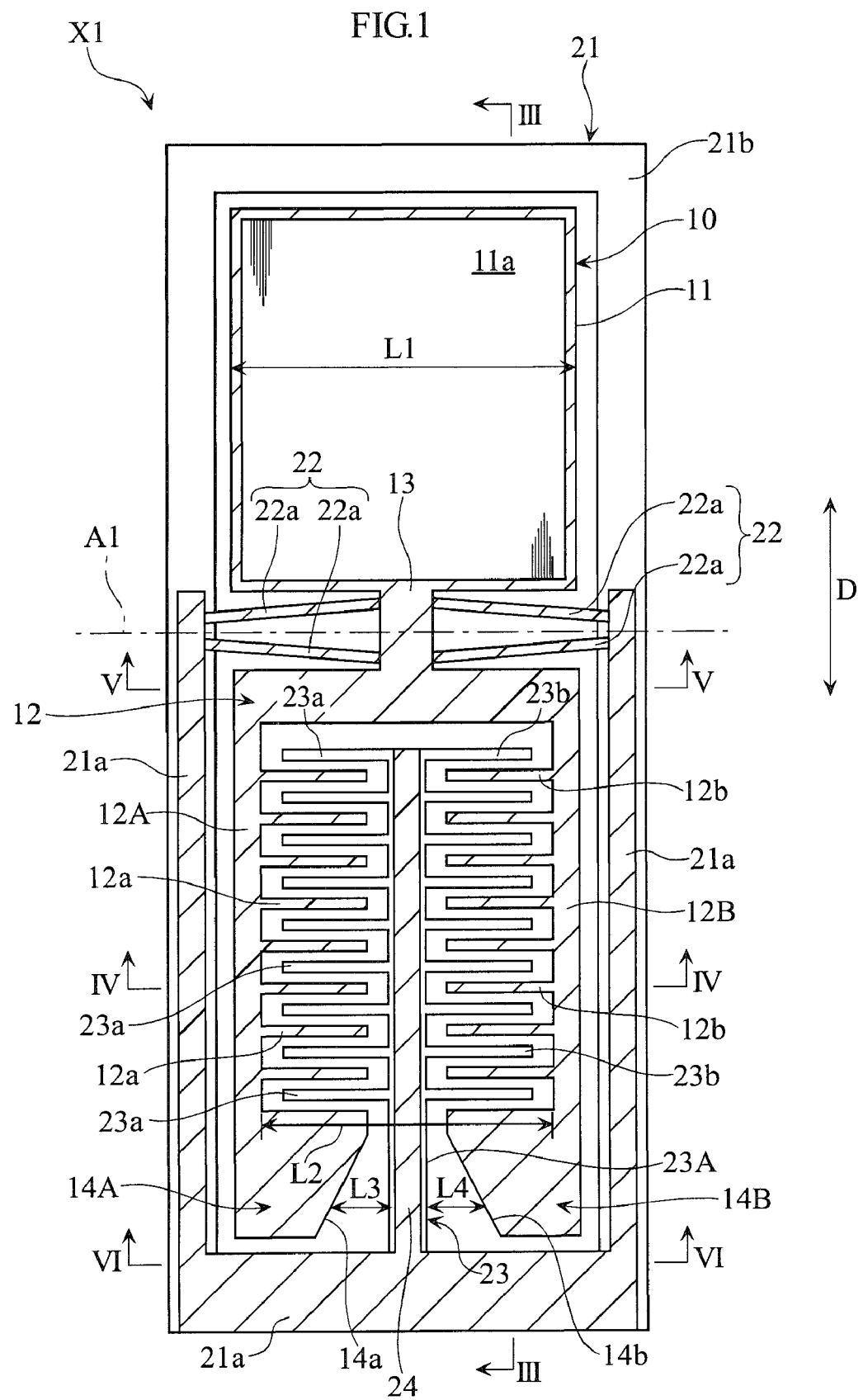
FIG. 1 is a plan view showing a micro-oscillation element according to a first embodiment of the present invention.
Figure 2:
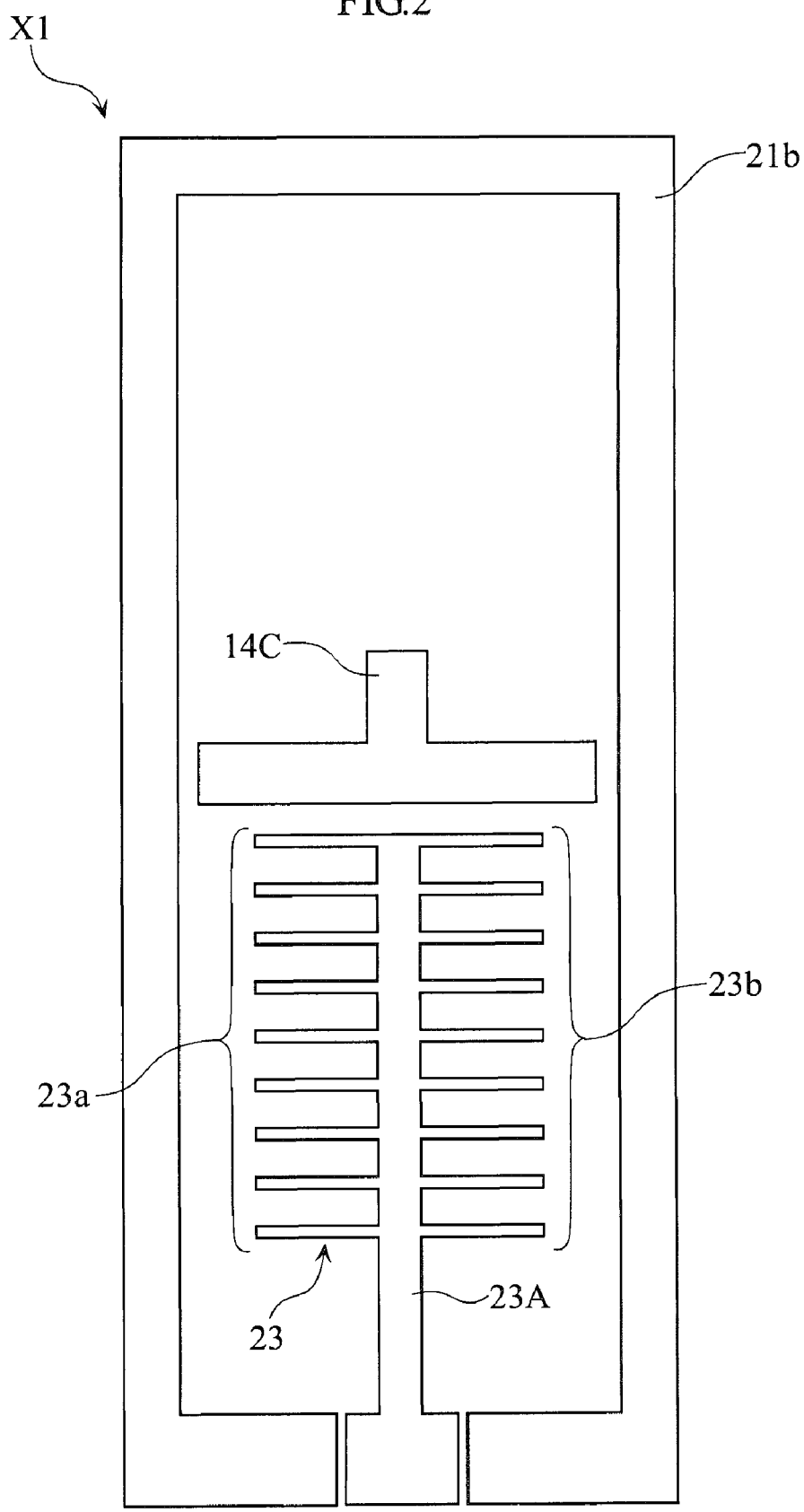
FIG. 2 is a plan view of part of the micro-oscillation element shown in FIG. 1.
Figure 3:
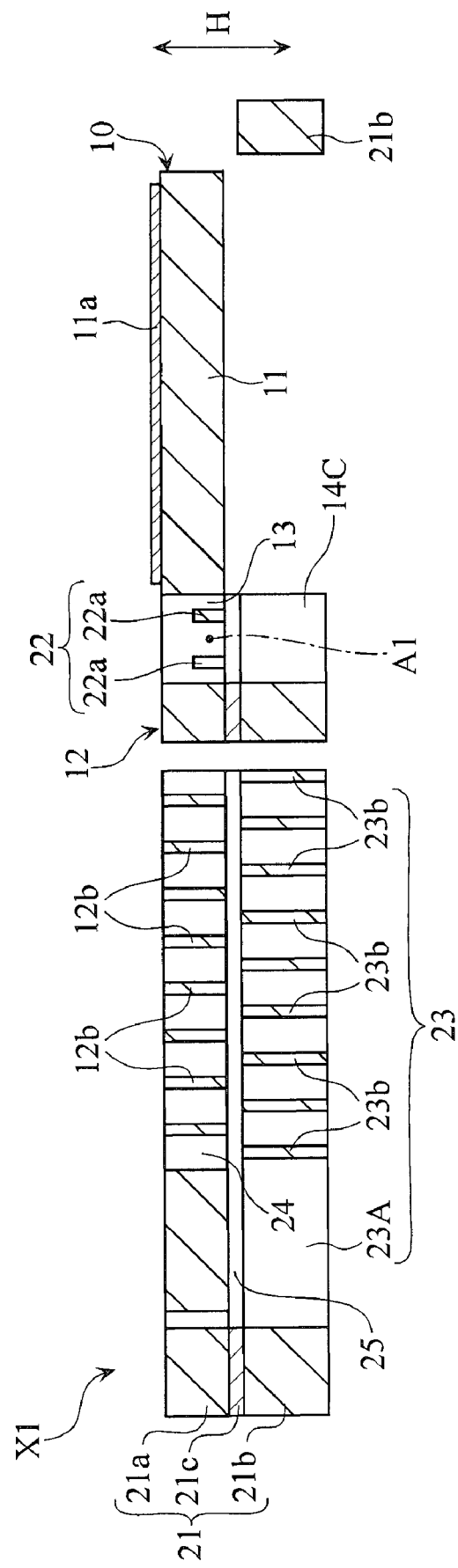
FIG. 3 is a cross-sectional view taken along a line III-III in FIG. 1.
Figure 4:
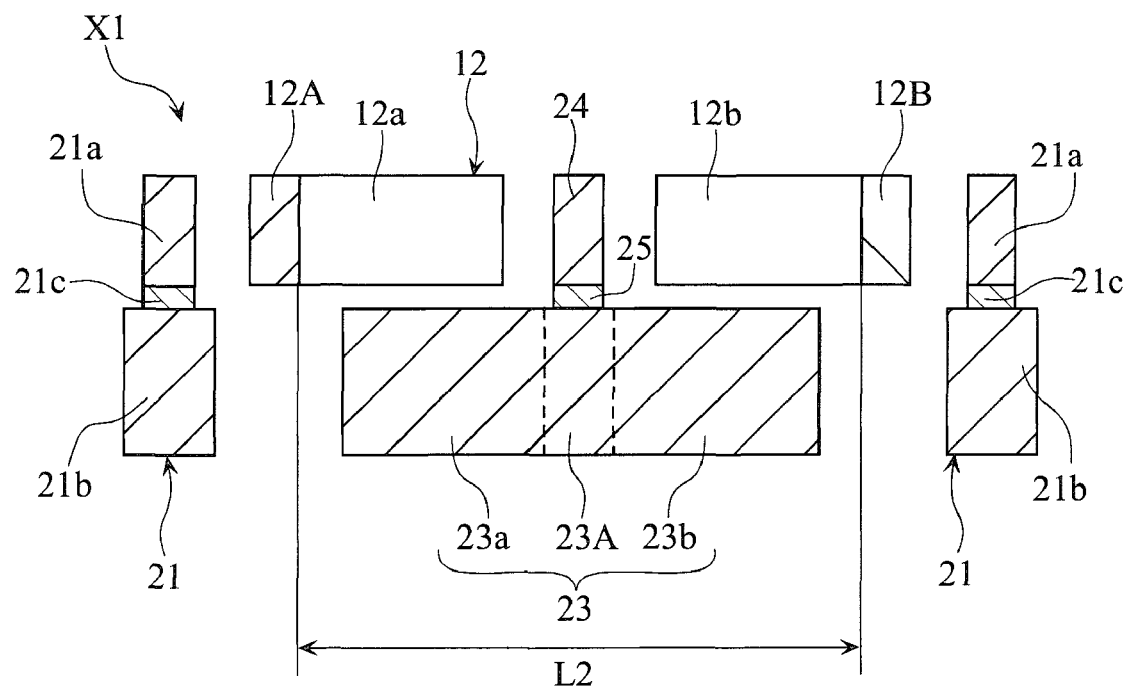
FIG. 4 is an enlarged cross-sectional view taken along a line IV-IV in FIG. 1.
Figure 5:
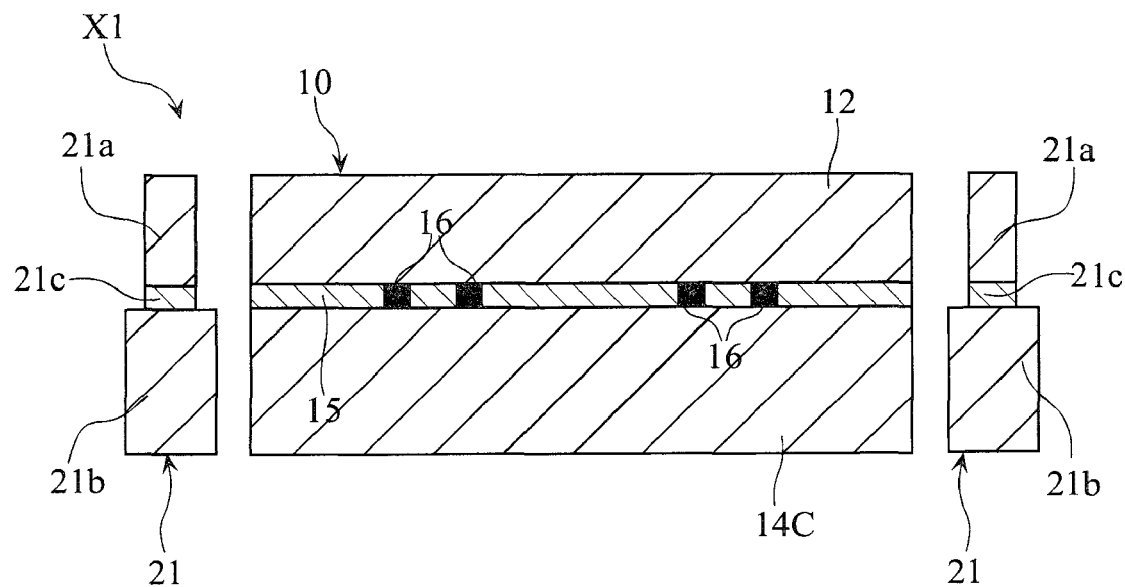
FIG. 5 is an enlarged cross-sectional view taken along a line V-V in FIG. 1.
Figure 6:
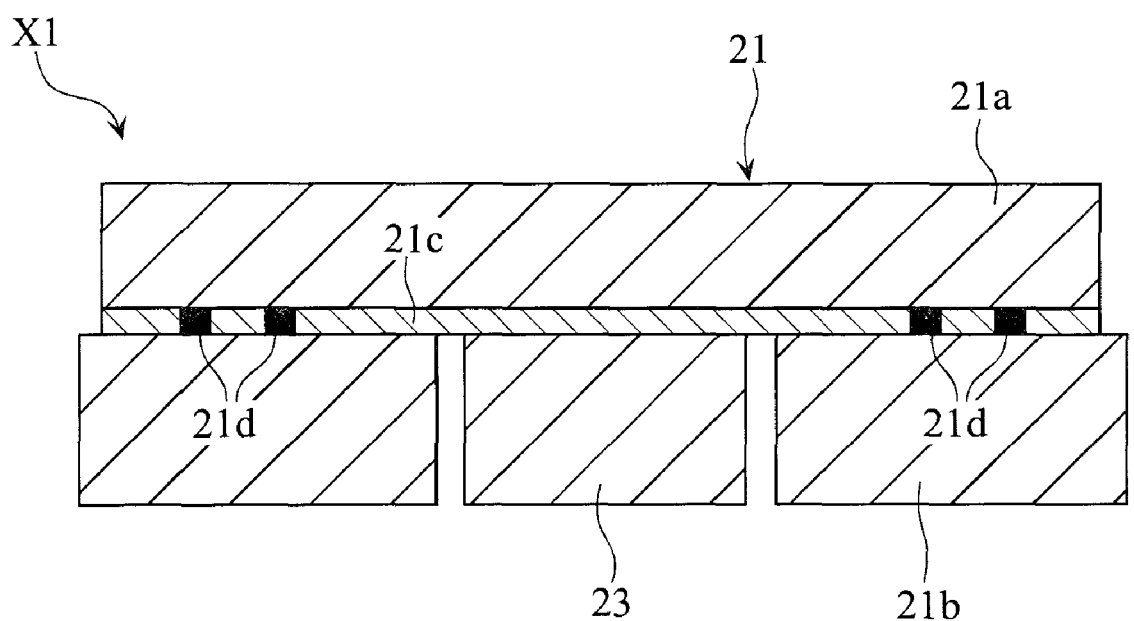
FIG. 6 is a cross-sectional view taken along a line VI-VI in FIG. 1.

FIGS. 1 to 6 depict a micro-oscillation element X1 according to a first embodiment of the present invention. FIG. 1 is a plan view showing the micro-oscillation element X1; FIG. 2 is a fragmentary plan view of the micro-oscillation element X1; and FIG. 3 is a cross-sectional view taken along a line III-III in FIG. 1. FIGS. 4 to 6 are enlarged cross-sectional views taken along a line IV-IV, V-V, and VI-VI in FIG. 1, respectively.

The micro-oscillation element X1 includes an oscillating portion 10, a base frame 21, a pair of link portions 22, a driving electrode 23, and a shield electrode portion 24, and is built up as a micromirror element in this embodiment. The micromirror element X1 is herein assumed to be manufactured through processing a material substrate which is so called a silicon-on-insulator (SOI) wafer, by a bulk micromachining technique such as a MEMS technique. The material substrate has a multilayer structure including a first and a second silicon layer, and an insulating layer provided between the silicon layers, which are given predetermined conductivity by doping an impurity. Whereas each of the foregoing portions constituting the micro-oscillation element X1 is formed based on at least one of the first silicon layer and the second silicon layer, the portions originating from the first silicon layer and located closer to the viewer than the insulating layer are hatched in FIG. 1, for the sake of explicitness of the drawing. In contrast, FIG. 2 depicts the portions of the micro-oscillation element X1 originating from the second silicon layer.

The oscillating portion 10 includes a land portion 11, a driving electrode 12, a beam portion 13, and weight portions 14A, 14B, 14C.

The land portion 11 originates from the first silicon layer, and includes on its surface a mirror portion 11a that reflects light. The land portion 11 and the mirror portion 11a constitute the movable functional portion according to the present invention. A length related to the land portion 11 or the movable functional portion, indicated by L1 in FIG. 1, is 20 to 300 μm for example.

The driving electrode 12 originates from the first silicon layer, and includes a pair of arms 12A, 12B, a plurality of electrode teeth 12a, and a plurality of electrode teeth 12b. The arms 12A, 12B are parallel in a direction indicated by an arrow D in FIG. 1. The electrode teeth 12a extend from the arm 12A toward the arm 12B as shown in FIGS. 1 and 4, and are spacedly aligned along the extending direction of the arm 12A, as shown in FIG. 1. The electrode teeth 12b extend from the arm 12B toward the arm 12A, and are spacedly aligned along the extending direction of the arm 12B. The driving electrode 12 is to accept a predetermined reference potential (for example, a ground potential) when the micro-oscillation element X1 is driven. The driving electrode 12 thus configured corresponds to the first driving electrode according to the present invention.

The beam portion 13 originates from the first silicon layer, and connects the land portion 11 and the driving electrode 12.

The weight portion 14A is fixed to an end portion of the arm 12A of the driving electrode 12, and electrically connected to the driving electrode 12. The weight portion 14A can receive a potential through the driving electrode 12.

The weight portion 14B is fixed to an end portion of the arm 12B of the driving electrode 12, and electrically connected to the driving electrode 12. The weight portion 14B can receive a potential through the driving electrode 12.

The weight portion 14C originates, as shown in FIG. 2, from the second silicon layer, and is coupled to the driving electrode 12 via the insulating layer 15, between the land portion 11 and the driving electrode 12, as shown in FIG. 5. The weight portion 14C and the driving electrode 12 are electrically connected through a conductive via 16 penetrating through the insulating layer 15. The weight portion 14C thus configured corresponds to the additional weight portion according to the present invention.

The frame 21 has a multilayer structure including, for example as shown in FIGS. 3 and 6, a first layered structure 21a originating from the first silicon layer, a second layered structure 21b originating from the second silicon layer, and an insulating layer 21c provided between the first and the second layered structure 21a, 21b. The first layered structure 21a has a shape that partially surrounds the oscillating portion 10, as shown in FIG. 1. The second layered structure 21b has a shape that surrounds the entirety of the oscillating portion 10, and constitutes the main body of the frame. The first layered structure 21a and the second layered structure 21b are, as shown in FIG. 6, electrically connected through a conductive via 21d penetrating through the insulating layer 21c.

The link portion 22 respectively includes a pair of torsion bars 22a, as shown in FIG. 1. Each of the torsion bars 22a originates from the first silicon layer, and connects the beam portion 13 of the oscillating portion 10 and the first layered structure 21a of the frame 21, thereby connecting the oscillating portion 10 and the frame 21. Through the torsion bar 22a, the beam portion 13 and the first layered structure 21a are electrically connected. The spacing between the pair of torsion bars 22a constituting the link portion 22 gradually increases in a direction from the frame 21 toward the oscillating portion 10. The torsion bars 22a are thinner than the oscillating portion 10, and thinner than the first layered structure 21a of the frame 21, in the thicknesswise direction H as shown in FIG. 3. The pair of link portions 22 thus configured defines an axis A1 of the oscillating motion of the oscillating portion 10, or the land portion 11. The axis A1 is orthogonal to the direction indicated by the arrow D in FIG. 1, in other words to the extending direction of the arms 12A, 12B of the driving electrode 12. The link portions 22 which include the pair of torsion bars 22a, oriented such that the spacing therebetween gradually increases in a direction from the frame 21 toward the land portion 11, are advantageous for suppressing emergence of unnecessary displacement component in the oscillating motion of the land portion 11.

As is apparent from FIG. 2, the driving electrode 23 originates from the second silicon layer, and includes an arm 23A, a plurality of electrode teeth 23a, and a plurality of electrode teeth 23b. The arm 23A extends in the direction indicated by the arrow D in FIG. 1. The plurality of electrode teeth 23a extends from the arm 23A toward the arm 12A of the driving electrode 12, and is spacedly aligned along the extending direction of the arm 23A. The plurality of electrode teeth 23b extends from the arm 23A toward the arm 12B, and is spacedly aligned along the extending direction of the arm 23A. The driving electrode 23 is located close to the driving electrode 12, as well as to the weight portions 14A, 14B.

The shield electrode portion 24 originates from the first silicon layer, and, for example as shown in FIG. 4, is coupled to the arm 23A of the driving electrode 23 via the insulating layer 25. The shield electrode portion 24 and the driving electrode 23 are electrically isolated from each other. The shield electrode portion 24 is an extended portion of the first layered structure 21a of the frame 21 as shown in FIG. 1, and electrically connected thereto.

In the micro-oscillation element X1, the pair of driving electrodes 12, 23 constitutes a driving mechanism or an actuator that generates the driving force to be applied to the oscillating portion 10. In the driving mechanism, the arms 12A, 12B of the driving electrode 12 spacedly extend in a direction orthogonal to the axis A1. The pair of arms 12A, 12B constitutes an outermost portion of the structure of the driving mechanism including the driving electrodes 12, 23, in the extending direction of the axis A1 associated with the oscillating portion 10. The driving electrode 23 is located, as shown in FIGS. 1 and 4, within the spacing L2 between the arms 12A and 12B. The spacing L2 is, for example, 10 to 300 μm.

In the oscillating portion 10 of the foregoing micro-oscillation element X1, the land portion 11, the driving electrode 12, and the weight portions 14A, 14B are arranged such that the driving electrode 12, which has a more sparse structure than the land portion 11, is located between the land portion 11 and the weight portions 14A, 14B. Whereas the axis A1 of the oscillating motion of such oscillating portion 10 is defined by the link portion 22 or torsion bar 22a connected to the beam portion 13 between the land portion 11 and the driving electrode 12 so as to connect the frame 21 and the oscillating portion 10, providing the weight portions 14A, 14B on the side of the driving electrode 12 having a relatively sparse structure facilitates achieving desirable weight balance in the oscillating portion 10 including the land portion 11 and the driving electrode 12 (in particular, the desirable weight balance between the portions extending from the axis A1 in one direction and in the opposite direction along the arrow D in FIG. 1). Thus, the micro-oscillation element X1 is appropriate for achieving desirable weight balance of the oscillating portion 10.

The oscillating portion 10 of the micro-oscillation element X1 further includes a weight portion 14C, in addition to the weight portions 14A, 14B. The weight portion 14C is stacked on the driving electrode 12 in a thicknesswise direction H of the oscillating portion 10. Such weight portion 14C contributes to achieving desirable weight balance about the axis A1 in the oscillating portion 10 including the land portion 11, the driving electrode 12, and the weight portions 14A, 14B (in particular, the desirable weight balance between the structure on one side and on the opposite side of the axis A1, in the thicknesswise direction H of the oscillating portion 10).

Providing the weight portions 14A, 14B, 14C enables achieving desirable weight balance about the axis A1 of the oscillating portion 10 of the micro-oscillation element X1. To be more detailed, the oscillating portion 10 includes the weight portions 14A, 14B, 14C in addition to the land portion 11, the driving electrode 12, and the beam portion 13, so that the structure in the oscillating portion 10 on the right of the axis A1 in FIG. 3 (including the land portion 11, a part of the beam portion 13, and a part of the weight portion 14C) and the structure in the oscillating portion 10 on the left of the axis A1 in FIG. 3 (including the driving electrode 12, a part of the beam portion 13, and a part of the weight portions 14A, 14B and of the weight portion 14C) have a substantially equal mass (in other words, the structure above the axis A1 in FIG. 1 and the structure below the axis A1 in FIG. 1 in the oscillating portion 10 have a substantially equal mass), and also the structure in the oscillating portion 10 above the axis A1 in FIG. 3 (including a part of the land portion 11, of the driving electrode 12, of the beam portion 13, and of the weight portions 14A, 14B) and the structure below the axis A1 in FIG. 3 (including a part of the land portion 11, of the driving electrode 12, of the beam portion 13, of the weight portions 14A, 14B, and of the weight portion 14C) have a substantially equal mass.

Figure 7:
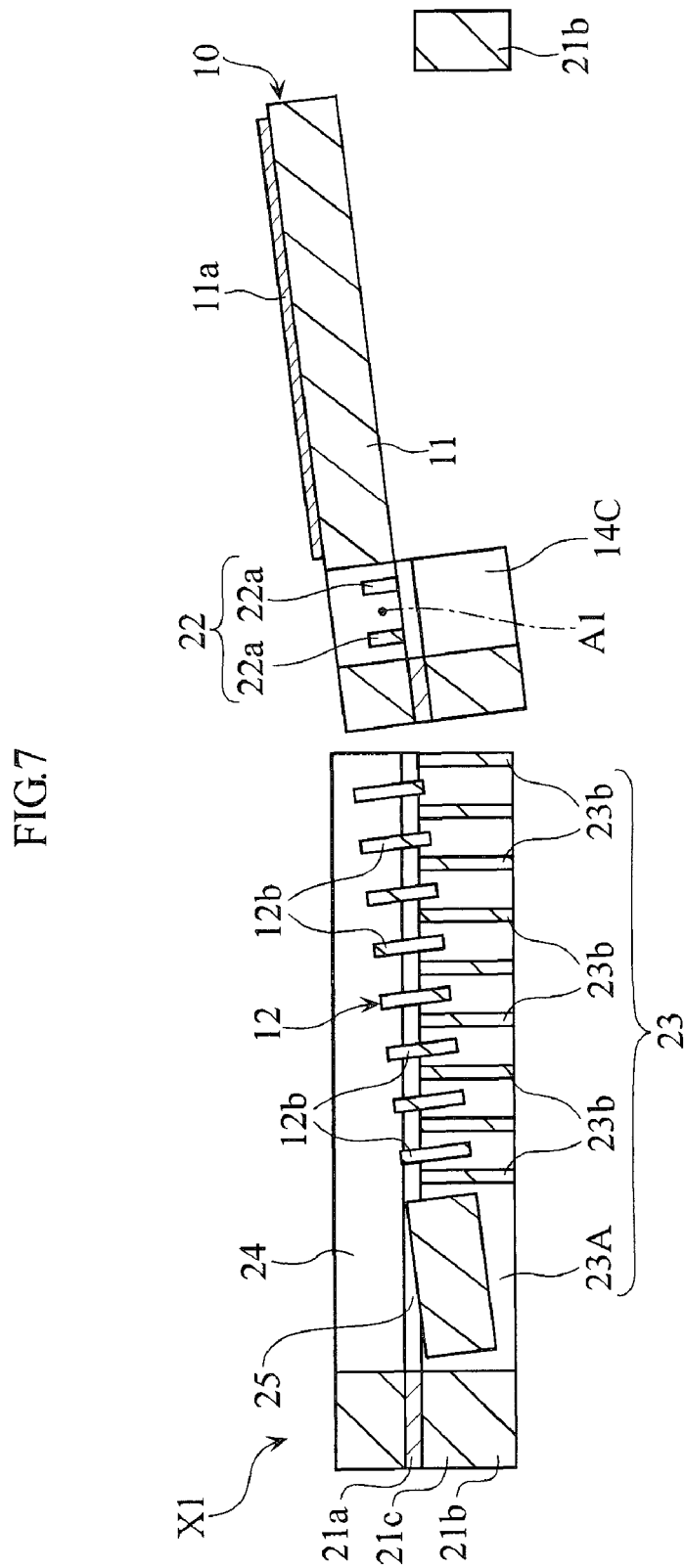
FIG. 7 is a cross-sectional view taken along a line III-III in FIG. 1, in a driving condition.

To drive the micro-oscillation element X1, a predetermined reference potential is applied to the driving electrode 12 of the oscillating portion 10. The reference potential may be applied to the driving electrode 12 through the first layered structure 21a of the frame 21, the torsion bar 22a of the link portion 22, and the beam portion 13 of the oscillating portion 10. The reference potential is the ground potential for example, and preferably maintained at a constant level. Then upon applying a higher driving potential than the reference potential to the driving electrode 23, static attraction can be generated between the driving electrodes 12 and 23 (between the electrode teeth 12a and 23a, and between the electrode teeth 12b and 23b). Once the static attraction generated between the driving electrodes 12 and 23 reaches a predetermined value, the driving electrode 12 is attracted toward the driving electrode 23. Accordingly, the oscillating portion 10, or the land portion 11, oscillates about the axis A1, to be rotationally displaced in an angle where the static attraction and the total torsional resistance of the respective torsion bars 22a are balanced. Under the balanced state, the driving electrodes 12, 23 assume the orientation as shown in FIG. 7, for example. The amount of the rotational displacement in the oscillating motion can be controlled by adjusting the driving potential applied to the driving electrode 23. Upon canceling the static attraction between the driving electrodes 12 and 23, the torsion bars 22a restore the natural state, so that the oscillating portion 10 or the land portion 11 assumes the orientation as shown in FIG. 3. Driving thus the oscillating portion 10 or the land portion 11 to oscillate allows changing as desired the direction of light reflected by the mirror portion 11a provided on the land portion 11.

Such structure of the micro-oscillation element X1, including the weight portions 14A, 14B, and 14C so as to achieve the desirable weight balance of the oscillating portion 10, facilitates controlling the amount of the rotational displacement in the oscillating motion of the oscillating portion 10 with high accuracy.

In the micro-oscillation element X1, the predetermined potential can be applied to the driving electrode 12 as well as to the weight portions 14A, 14B as already stated, which enables generating the electrostatic force working as the driving force between the driving electrodes 12 and 23, and also between the weight portions 14A, 14B and the driving electrode 23. Such additional electrostatic force can be utilized as the driving force for causing the oscillating portion 10 to oscillate.

In the micro-oscillation element X1, the weight portion 14A includes a portion 14a where a spacing L3 between the weight portion 14A and the driving electrode 23 gradually increases toward a farther position from the driving electrode 12 (i.e. farther from the axis A1 of the oscillating motion). Likewise, the weight portion 14B includes a portion 14b where a spacing L4 between the weight portion 14B and the driving electrode 23 gradually increases toward a farther position from the driving electrode 12 (i.e. farther from the axis A1). Such configuration facilitates decreasing electrostatic force per unit area generated between the weight portions 14A, 14B and the driving electrode 23, at a farther position from the driving electrode 12, hence from the axis A1, in the weight portions 14A, 14B. Accordingly, the foregoing structure is advantageous for suppressing the momentum acting in a direction to bend the driving electrode 12 (arms 12A, 12B), to which the weight portions 14A, 14B are joined, and thereby preventing undue deformation of the driving electrode 12.

In the micro-oscillation element X1, the arms 12A, 12B included in the driving electrodes 12 constitute an outermost portion of the structure of the driving mechanism including the driving electrodes 12, 23, in the extending direction of the axis A1 associated with the oscillating portion 10, and the reference potential (for example, ground potential) is applied to the driving electrode 12 including the arms 12A, 12B, for driving the micro-oscillation element X1. The driving electrode 23 is located within the spacing L2 between the arms 12A and 12B thus configured. Such configuration facilitates the arms 12A, 12B of the driving electrode 12 to absorb the electric field emitted from the driving electrode 23, which originates from the predetermined driving potential higher than the reference potential upon driving the micro-oscillation element X1. In other words, the electric field emitted from the driving electrode 23 barely leaks out of the driving mechanism beyond the arms 12A, 12B. Accordingly, the micro-oscillation element X1 is appropriate for suppressing field leak when being driven. Such micro-oscillation element X1 is advantageous for constituting a micro-oscillation element array having high element density. In such micro-oscillation element array, a plurality of micro-oscillation elements X1 may be arranged either one-dimensionally or two-dimensionally.

In the micro-oscillation element X1, the driving electrode 12, the weight portion 14C of the oscillating portion 10, the first layered structure 21a and the second layered structure 21b of the frame 21, and the shield electrode portion 24 are electrically connected. Accordingly, when the micro-oscillation element X1 is driven the reference potential (for example, ground potential) is applied to the driving electrode 12 and also to the weight portion 14C, the first layered structure 21a, the second layered structure 21b, and the shield electrode portion 24. Such configuration facilitates the weight portion 14C to absorb the electric field emitted from the driving electrode 23, for example toward the land portion 11, originating from the predetermined driving potential higher than the reference potential, upon driving the micro-oscillation element X1. In other words, the weight portion 14C also serves as a shield electrode portion, so that the electric field barely reaches the land portion 11 for example, beyond the weight portion 14C. Also, the electric field emitted from the driving electrode 23 upon driving the micro-oscillation element X1 tends to be absorbed by the first layered structure 21a. In other words, the first layered structure 21a also serves as a shield electrode portion, so that the electric field barely leaks out of the element, beyond the first layered structure 21a of the frame 21. Further, the electric field emitted from the driving electrode 23 upon driving the micro-oscillation element X1 tends to be absorbed by the second layered structure 21b. In other words, the second layered structure 21b also serves as a shield electrode portion, so that the electric field barely leaks out of the element, beyond the second layered structure 21b of the frame 21. Still further, the electric field emitted from the electrode teeth 23a of the driving electrode 23 toward, for example, the arm 12B of the driving electrode 12, or from the electrode teeth 23b toward the arm 12A for example, upon driving the micro-oscillation element X1, tends to be absorbed by the shield electrode portion 24. Such field absorption effect also contributes to suppressing the field leak out of the micro-oscillation element X1.

Figure 8:
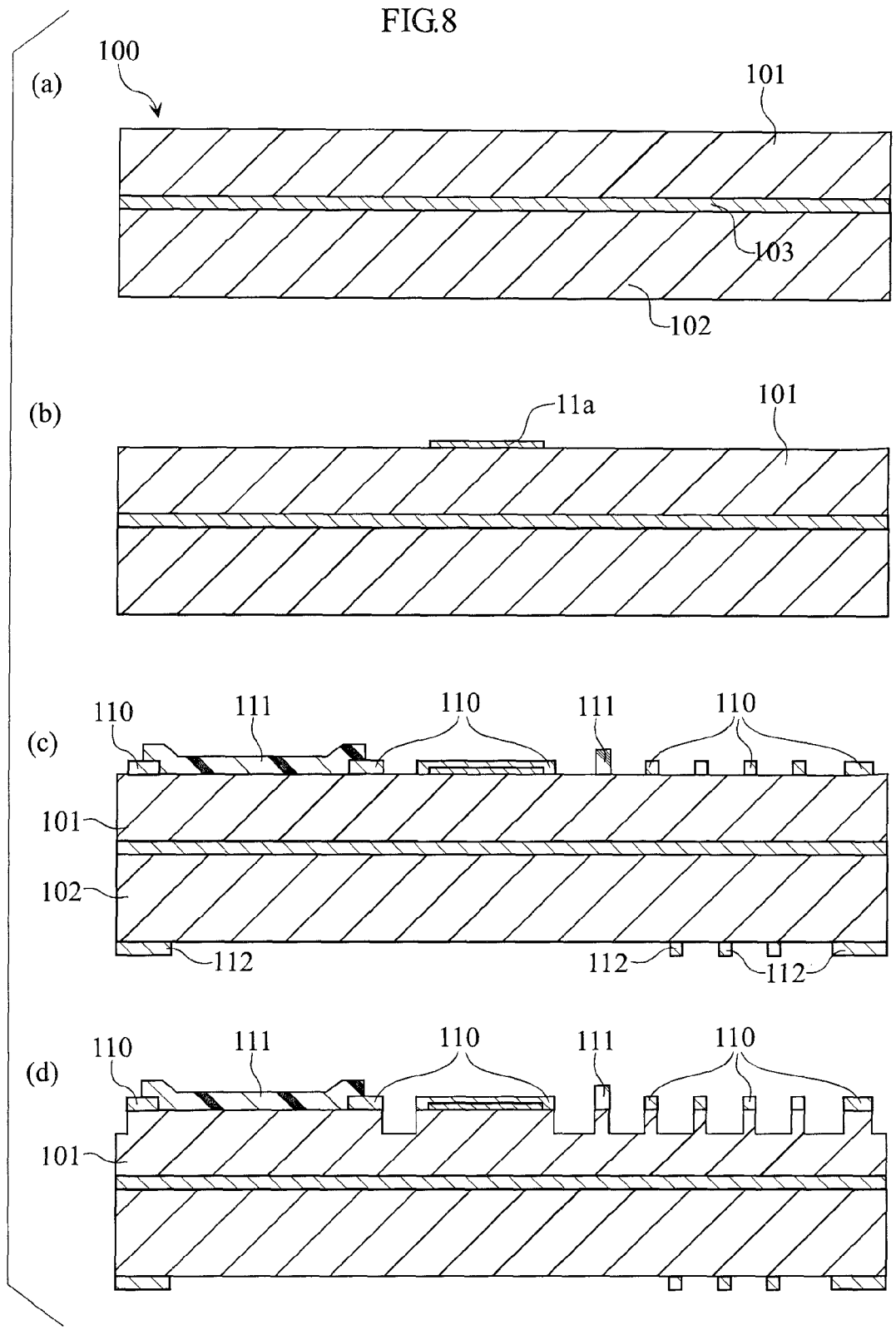
FIG. 8 shows some steps of a manufacturing process of the micro-oscillation element shown in FIG. 1.
Figure 9:
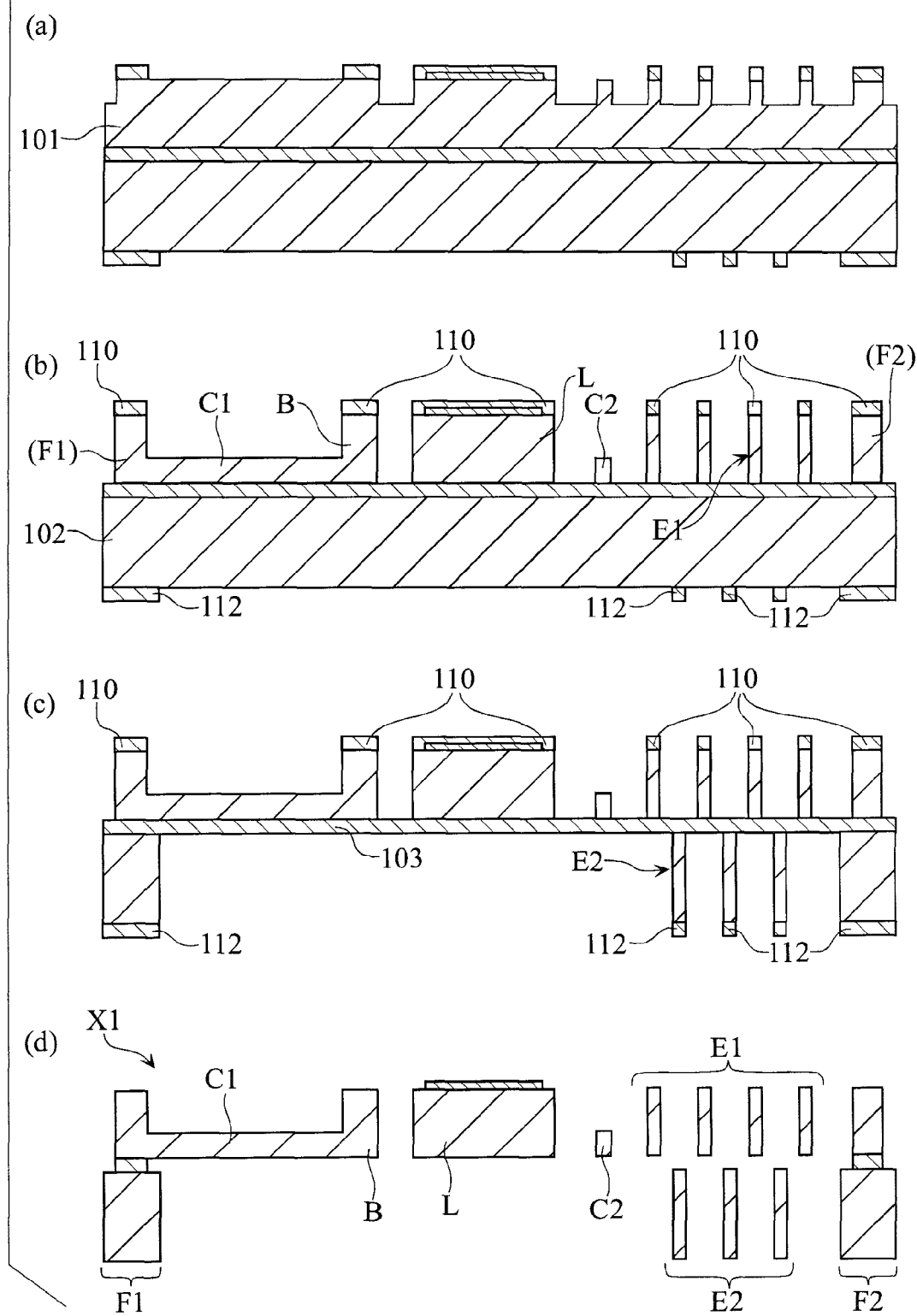
FIG. 9 shows some steps following the steps shown in FIG. 8.

FIGS. 8 and 9 show a manufacturing process of the micro-oscillation element X1. The manufacturing process of the micro-oscillation element X1 is based on the bulk micromachining technique. FIGS. 8 and 9 depict the changes of a same cross section, which take place before a land portion L, a beam portion B, frames F1, F2, link portions C1, C2, and a set of electrodes E1, E2 are obtained as shown in FIG. 9(d). The cross section represents, in schematic illustrations, a plurality of predetermined portions included in a region where a single micro-oscillation element is to be formed, on a material substrate (a wafer having a multilayer structure) to be processed. The land portion L corresponds to a part of the land portion 11. The beam portion B corresponds to the beam portion 13, and represents a cross section of the beam portion 13. The frames F1, F2 respectively correspond to the frame 21, and represent a cross section of the frame 21. The link portion C1 corresponds to the link portion 22, and represents a cross section of the torsion bar 22a taken along the extending direction thereof. The link portion C2 corresponds to the link portion 22, and represents a cross section of the torsion bar 22a. The electrode E1 corresponds to a part of the driving electrode 12, and represents a cross section of the electrode teeth 12a, 12b. The electrode E2 corresponds to a part of the driving electrode 23, and represents a cross section of the electrode teeth 23a, 23b.

A first step of the manufacturing process of the micro-oscillation element X1 is preparation of a material substrate 100 shown in FIG. 8(a). The material substrate 100 is a SOI wafer having a multilayer structure including silicon layers 101, 102, and an insulating layer 103 provided between the silicon layers 101, 102, and includes the conductive vias 16, 21d (not shown) buried in advance. The silicon layers 101, 102 are constituted of a silicon material made conductive by doping an impurity. Suitable impurities include a p-type impurity such as B, and an n-type impurity such as P or Sb. The insulating layer 103 is, for example, constituted of silicon oxide. The silicon layer 101 has a thickness of 10 to 100 μm for example, the silicon layer 102 50 to 500 μm for example, and the insulating layer 103 0.3 to 3 μm for example.

Referring to FIG. 8(b), the mirror portion 11a is formed on the silicon layer 101. To form the mirror portion 11a, a sputtering process is performed to sequentially deposit, for example, Cr (50 nm) and Au (200 nm) on the silicon layer 101. Then an etching process is sequentially performed on those metal layers via a predetermined mask, so as to pattern the mirror portion 11a. For Au, for example potassium iodide-iodine aqueous solution may be employed as the etching solution. For Cr, for example cerium(II) nitrate ammonium aqueous solution may be employed as the etching solution.

Figure 10:
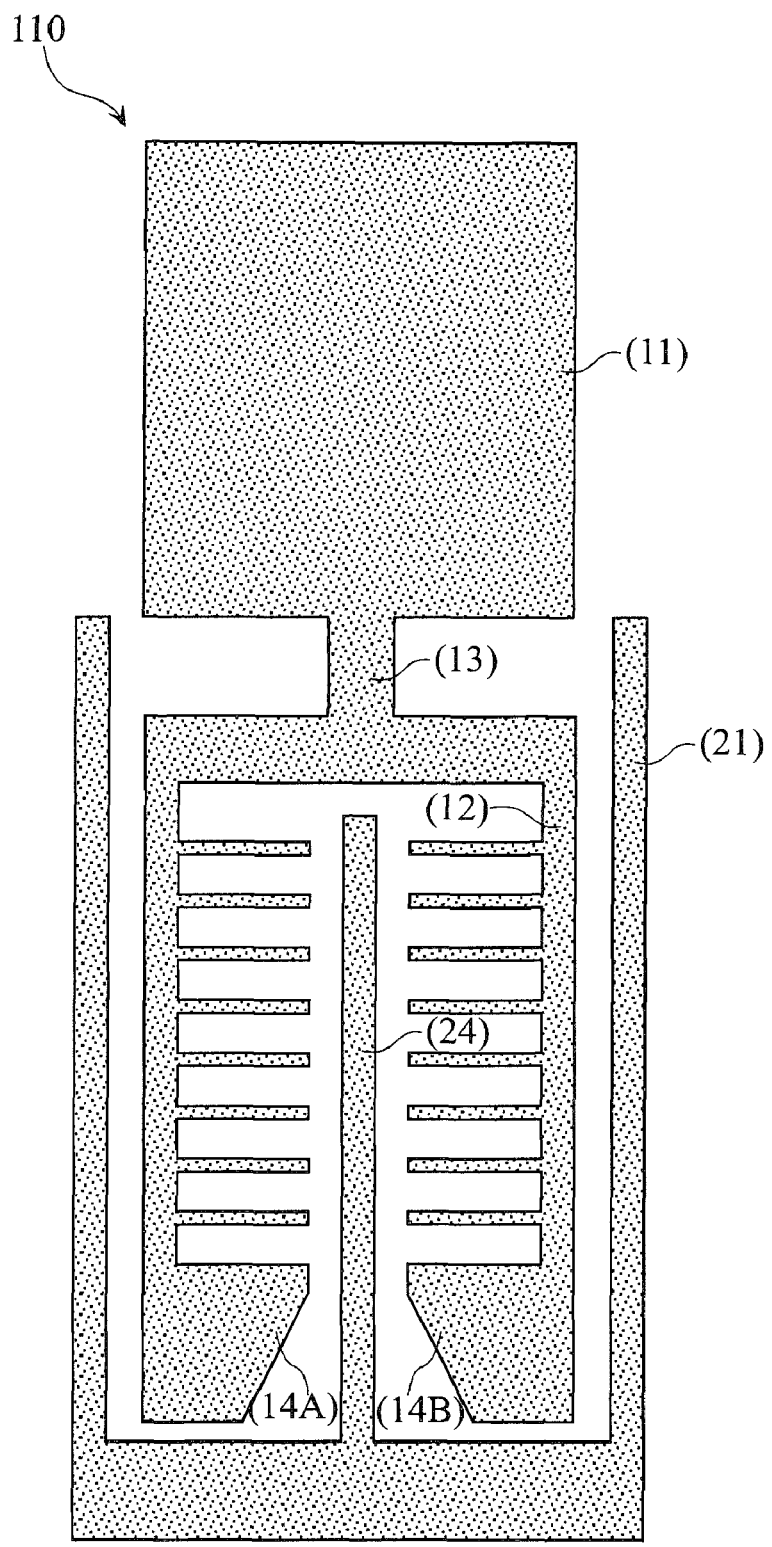
FIG. 10 is a plan view showing a mask pattern.
Figure 11:
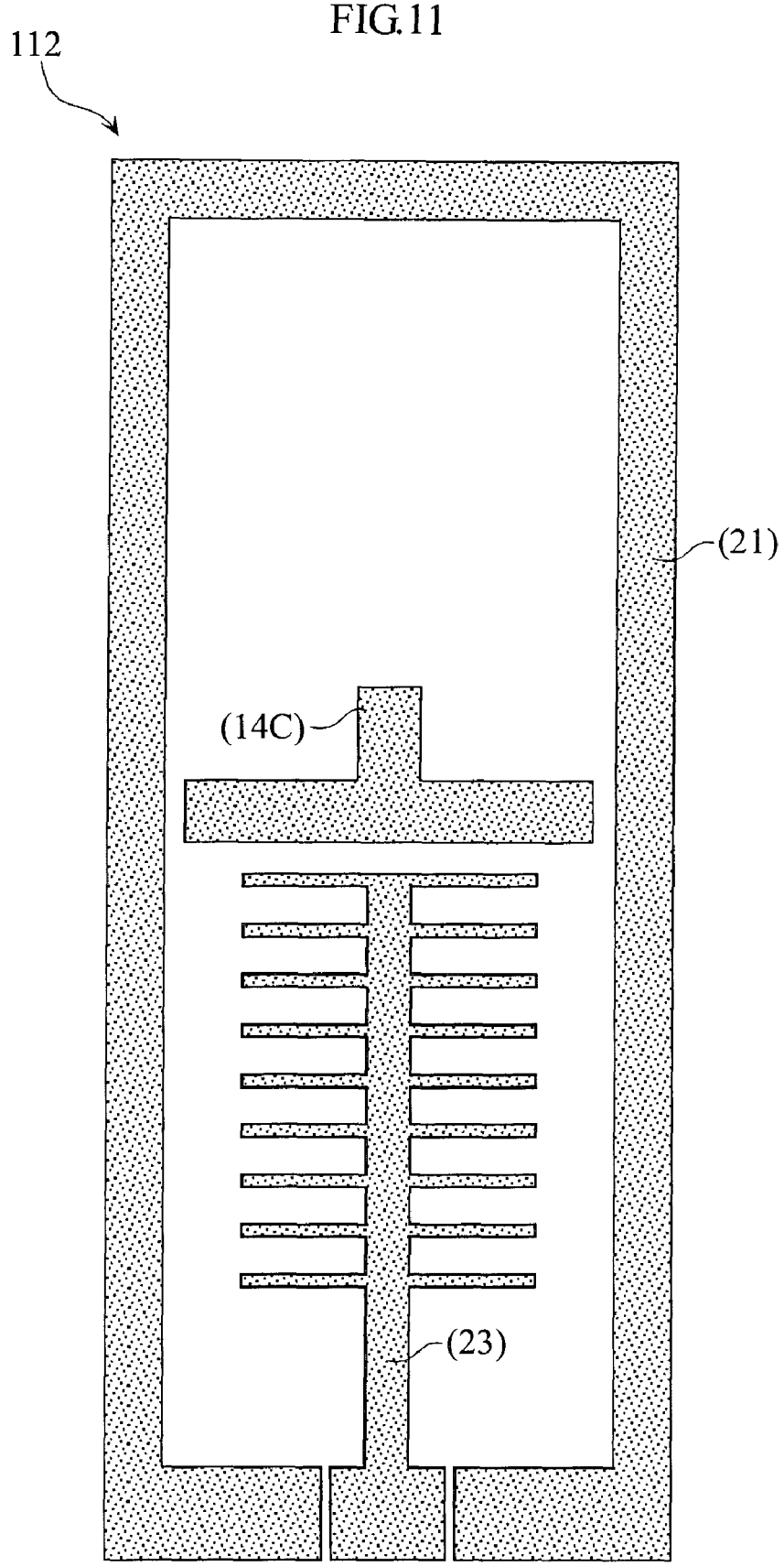
FIG. 11 is a plan view showing another mask pattern.

Referring to FIG. 8(c), an oxide layer pattern 110 and a resist pattern 111 are formed on the silicon layer 101, and an oxide layer pattern 112 is formed on the silicon layer 102. The oxide layer pattern 110 has a shape shown in FIG. 10, corresponding to the oscillating portion 10 (including the land portion 11, the beam portion 13, the driving electrode 12, and the weight portions 14A, 14B), a part of the frame 21, and the shield electrode portion 24, which are to be formed on the silicon layer 101. The resist pattern 111 has a shape corresponding to the link portion 22. The oxide layer pattern 112 has a shape shown in FIG. 11, corresponding to a part of the frame 21, the driving electrode 23, and the weight portion 14C to be formed on the silicon layer 102.

Then referring to FIG. 8(d), a deep reactive ion etching (hereinafter, DRIE) process is performed utilizing the oxide layer pattern 110 and the resist pattern 111 as the mask, to a predetermined depth over the silicon layer 101. The predetermined depth corresponds to the thickness of the link portions C1, C2, which is 5 μm for example. The DRIE process facilitates satisfactorily performing an anisotropic etching, based on a Bosch process including alternately repeating an etching process that utilizes $SF_6$ gas and sidewall protection that utilizes $C_4F_8$ gas. In the subsequent DRIE process also, such Bosch process may be employed.

Proceeding to FIG. 9(a), the resist pattern 111 is removed. To remove the resist pattern 111, a stripper may be applied.

Referring to FIG. 9(b), the DRIE process is performed utilizing the oxide layer pattern 110 as the mask, so as to residually form the link portions C1, C2, performing at the same time an etching process over the silicon layer 101 until reaching the insulating layer 103. Such etching process provides the oscillating portion 10 (including the land portion L, the beam portion B, and the electrode E1), a part of the frame 21 (including the frames F1, F2) (first layered structure 21a), the link portions 22 (including the link portions C1, C2), and the shield electrode portion 24.

Then referring to FIG. 9(c), the DRIE process is performed over the silicon layer 102 utilizing the oxide layer pattern 112 as the mask, until reaching the insulating layer 103. Such etching process provides a part of the frame 21 (including the frames F1, F2) (second layered structure 21b), and the driving electrode 23 (including the electrode E2), and the weight portion 14C.

Referring finally to FIG. 9(d), an exposed region of the insulating layer 103, and the oxide layer pattern 110, 112 are removed by etching. Here, either a dry etching or wet etching process may be performed. In the case of adopting the dry etching, suitable etching gases include $CF_4$ and $CHF_3$. For the wet etching, for example buffered hydrofluoric acid (BHF) composed of fluoric acid and ammonium fluoride may be employed as the etching solution.

Through such series of process, the land portion L, the beam portion B, the frames F1, F2, the link portions C1, C2, and a set of electrodes E1, E2 can be formed, to thereby manufacture the micro-oscillation element X1.

Figure 12:
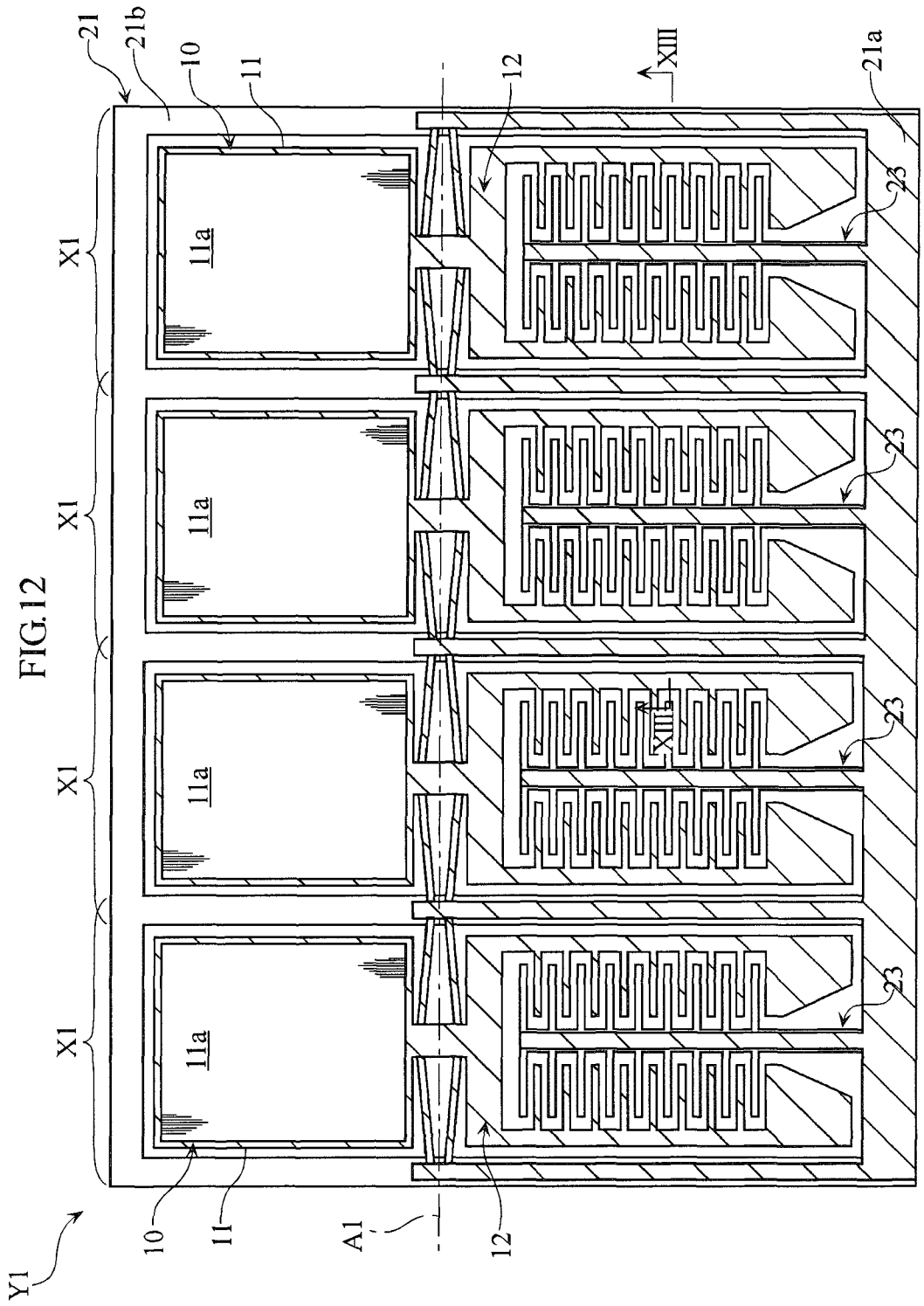
FIG. 12 is a plan view showing a micro-oscillation element array according to a second embodiment of the present invention.
Figure 13:
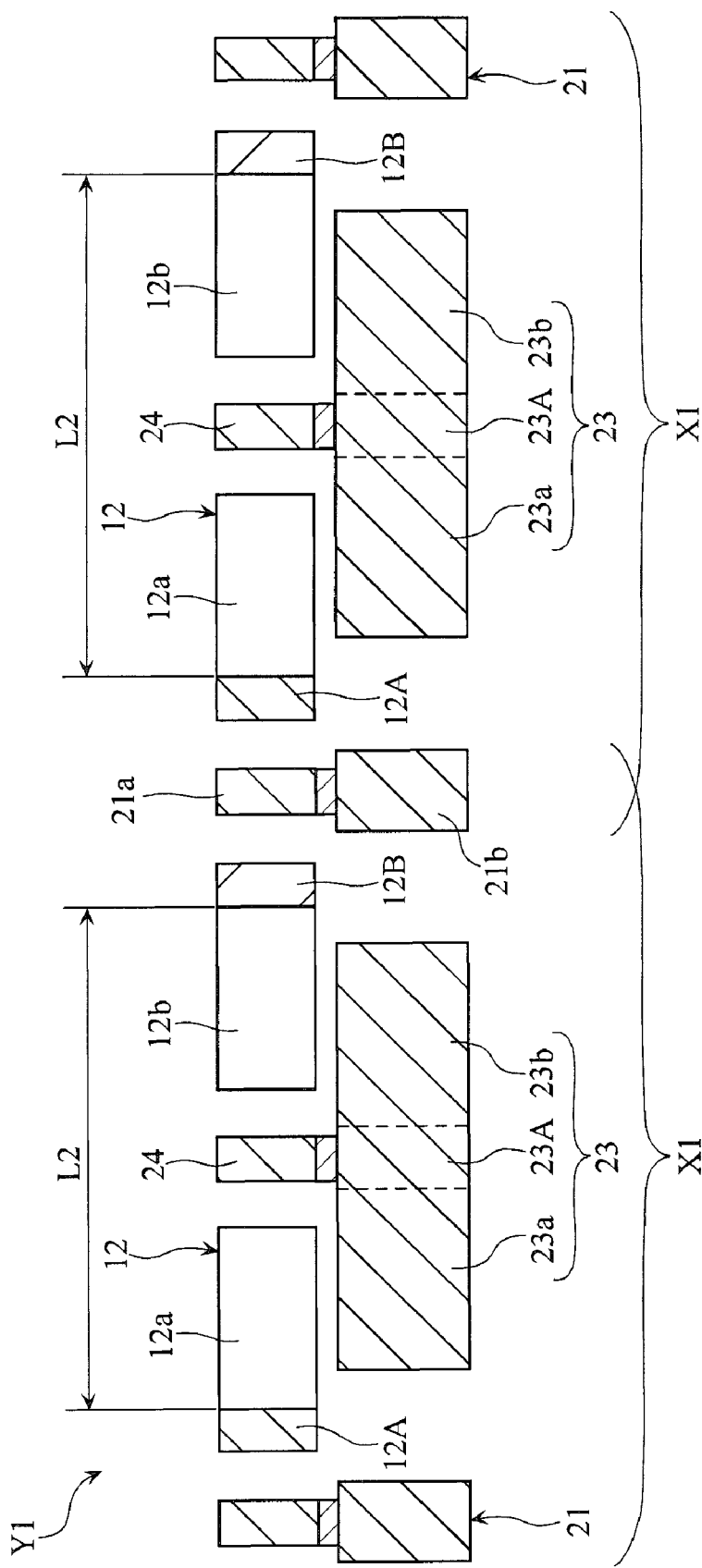
FIG. 13 is an enlarged cross-sectional view taken along a line XIII-XIII in FIG. 12.

FIG. 12 depicts a micro-oscillation element array Y1 according to a second embodiment. FIG. 13 is a fragmentary cross-sectional view taken along a line XIII-XIII in FIG. 12, showing a part of the micro-oscillation element array Y1.

The micro-oscillation element array Y1 includes a plurality (four in this embodiment) of micro-oscillation elements X1. In the micro-oscillation element array Y1, the plurality of micro-oscillation elements X1 is aligned in a row (one-dimensionally) along the direction of the axis A1. Accordingly, in the micro-oscillation element array Y1, a plurality of mirror portions 11a is aligned in a row along the direction of the axis A1.

In the micro-oscillation element array Y1, the first layered structure 21a of the frame 21 is continuous throughout all the micro-oscillation elements X1, and hence the driving electrode 12, the weight portion 14C of the oscillating portion 10, the first layered structure 21a and the second layered structure 21b of the frame 21, and the shield electrode portion 24 of all the micro-oscillation elements X1 are electrically connected.

To drive the micro-oscillation element array Y1, the predetermined driving potential is applied to the driving electrode 23 of a selected micro-oscillation element X1, with the predetermined reference potential being applied in common to the driving electrode 12 in the oscillating portion 10 of all the micro-oscillation elements X1. Accordingly, the oscillating portion 10, or the land portion 11, of the respective micro-oscillation element X1 is individually driven to oscillate, so as to change the direction of light reflected by the mirror portion 11a provided on the land portion 11 of the respective micro-oscillation element X1, as desired. The driving method of the micro-oscillation elements X1 is as described above regarding the foregoing embodiment.

As stated referring to the foregoing embodiment, each micro-oscillation element X1 includes the weight portions 14A, 14B, 14C so as to achieve the desirable weight balance of the oscillating portion 10, thereby facilitates controlling the amount of the rotational displacement in the oscillating motion of the oscillating portion 10 with high accuracy.

As stated referring to the foregoing embodiment, in each micro-oscillation element X1, the driving electrode 23 is located within the spacing L2 between the arms 12A, 12B, which constitute an outermost portion of the structure of the driving mechanism (driving electrodes 12, 23) in the extending direction of the axis A1, and to which the reference potential (for example, ground potential) is applied when the micro-oscillation element X1 is driven. Such configuration facilitates the arms 12A, 12B of the driving electrode 12 to absorb the electric field emitted from the driving electrode 23, which originates from the predetermined driving potential higher than the reference potential upon driving the micro-oscillation element X1, thereby suppressing the field leak. In the micro-oscillation element array Y1, therefore, there is little likelihood that the field leak from the driving mechanism (driving electrodes 12, 23) of one of the micro-oscillation elements X1 unduly affects the driving characteristic of the adjacent micro-oscillation element X1. The micro-oscillation element array Y1 thus configured is advantageous for achieving a narrower alignment pitch of the plurality of micro-oscillation elements X1, hence the plurality of mirror portions 11a. Thus, the micro-oscillation element array Y1 is appropriate for achieving higher density of the micro-oscillation elements X1, or the mirror portions 11a.

As stated referring to the foregoing embodiment, in each micro-oscillation element X1, not only the arms 12A, 12B of the driving electrode 12, but also the weight portion 14C, the first layered structure 21a, the second layered structure 21b, and the shield electrode portion 24 can absorb the electric field. The field absorption effect of those components also contributes to minimizing the likelihood that the field leak from the driving mechanism (driving electrode 12, 23) of one of the micro-oscillation elements X1 in the micro-oscillation element array Y1 unduly affects the driving characteristic of the adjacent micro-oscillation element X1.

Figure 14:
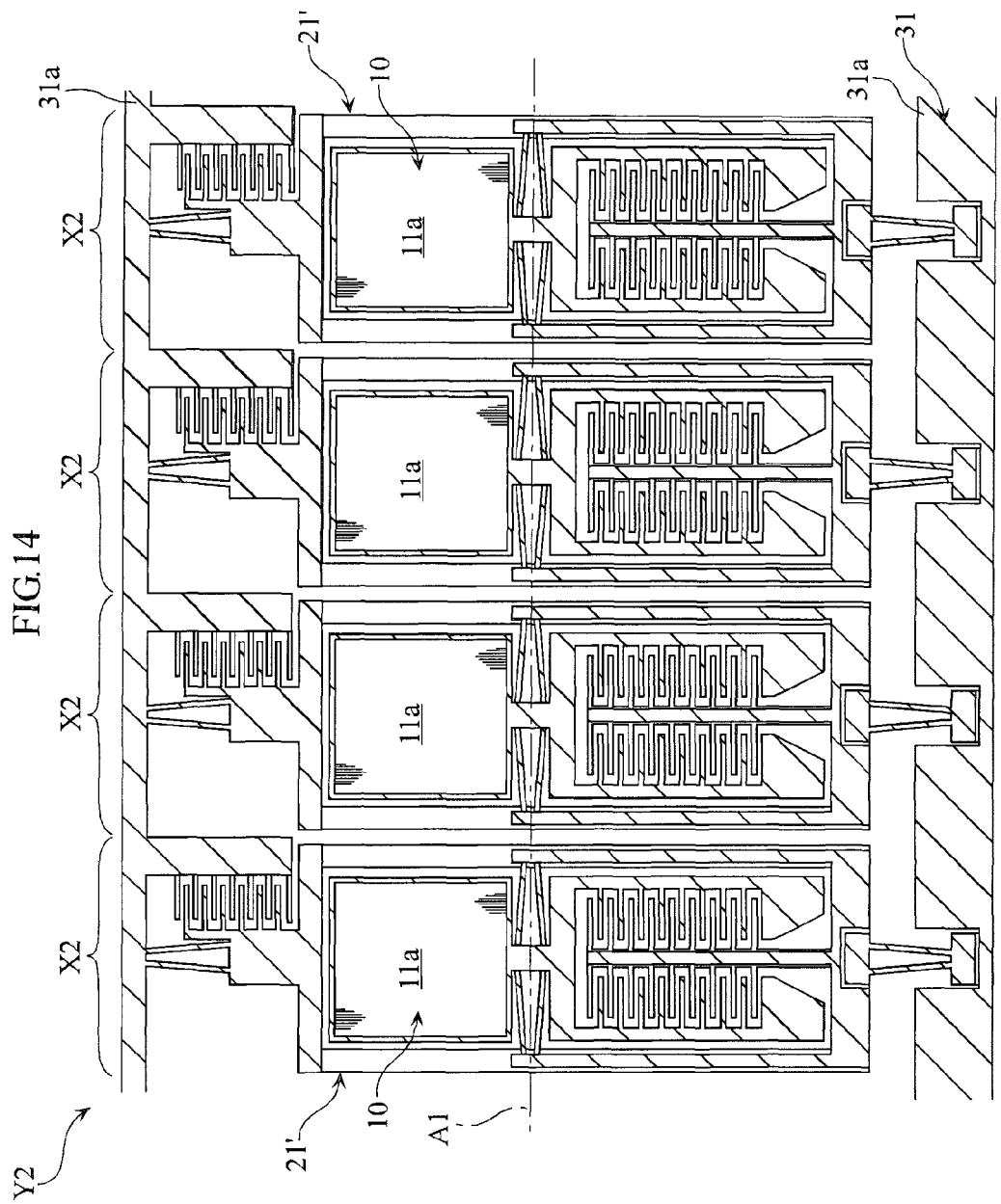
FIG. 14 is a plan view showing a micro-oscillation element array according to a third embodiment of the present invention.

FIG. 14 is a plan view showing a part of a micro-oscillation element array Y2 according to a third embodiment of the present invention. The micro-oscillation element array Y2 includes a plurality of micro-oscillation elements X2. In the micro-oscillation element array Y2, the plurality of micro-oscillation elements X2 is aligned in a row (one-dimensionally).

Figure 15:
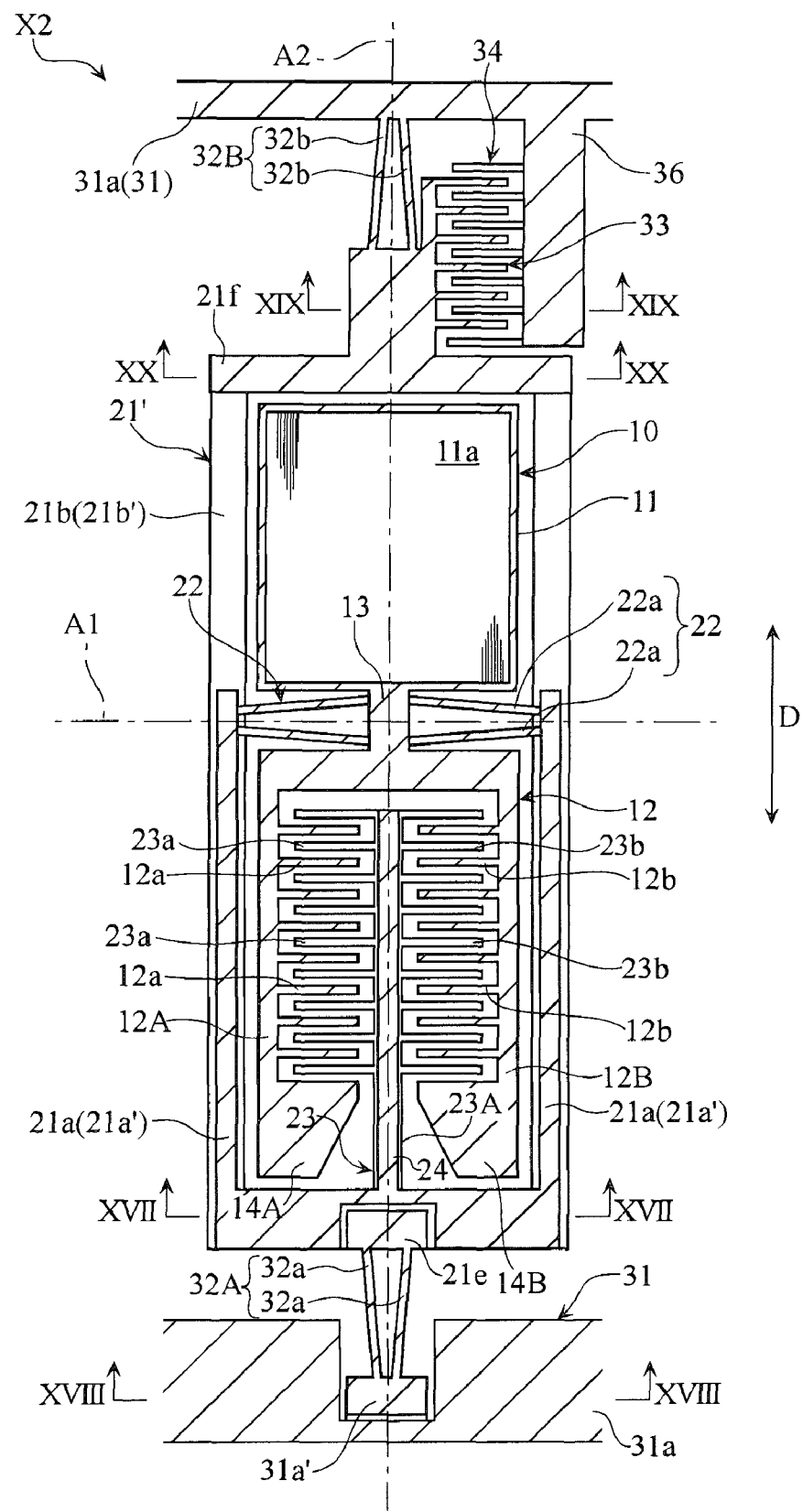
FIG. 15 is a plan view showing a micro-oscillation element included in the micro-oscillation element array shown in FIG. 14.
Figure 16:
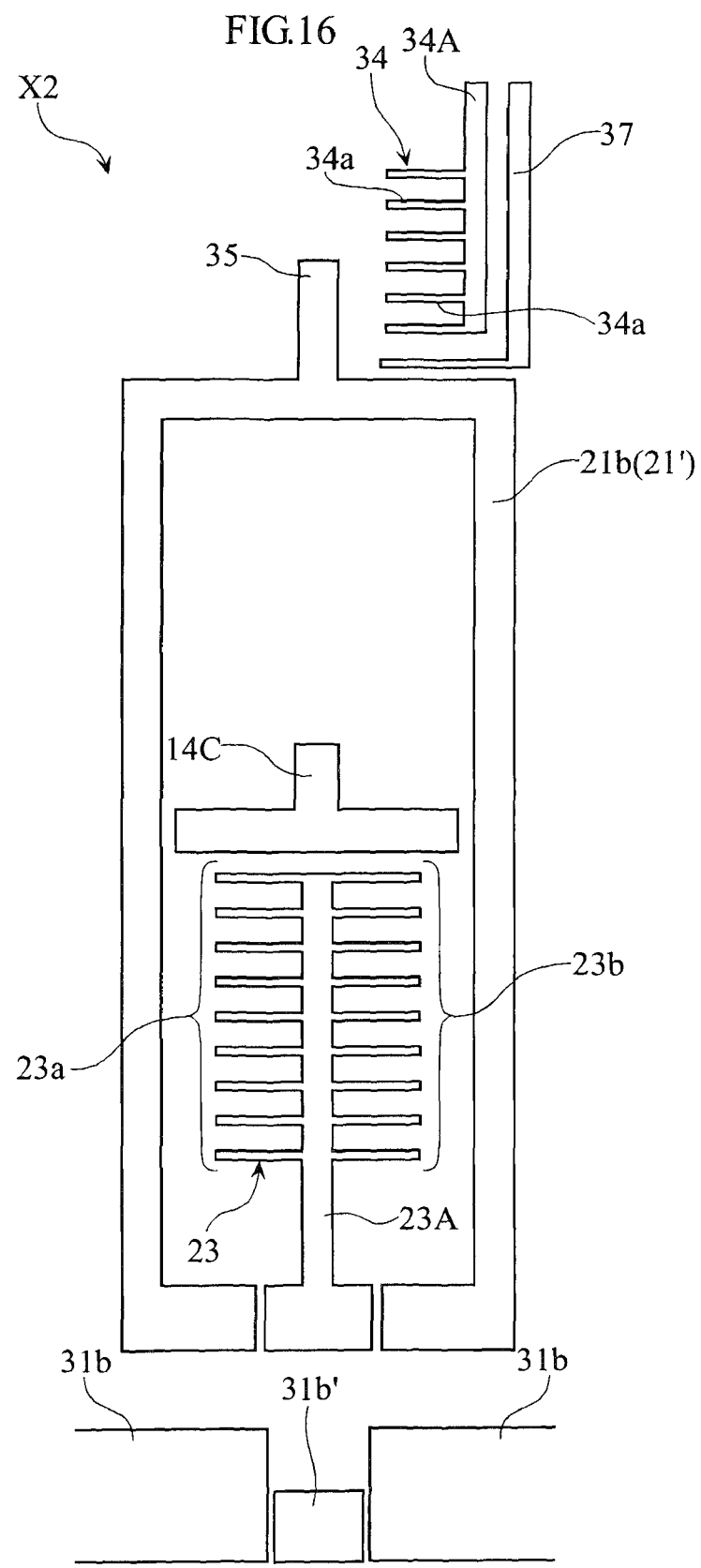
FIG. 16 is a fragmentary plan view of the micro-oscillation element shown in FIG. 15.

FIGS. 15 to 20 depict the micro-oscillation element X2 constituting the micro-oscillation element array Y2. FIG. 15 is a plan view of the micro-oscillation element X2, and FIG. 16 is a fragmentary plan view thereof. FIGS. 17 to 20 are cross-sectional views taken along a line XVII-XVII, XVIII-XVIII, XIX-XIX, and XX-XX in FIG. 15, respectively.

The micro-oscillation element X2 includes the oscillating portion 10, a frame 21', the pair of link portions 22, the driving electrode 23, the shield electrode portion 24, a frame 31, a pair of link portions 32A, 32B, driving electrodes 33, 34, and shield electrode portions 35, 36, 37, and is built up as a micromirror element in this embodiment. The micromirror element X2 is herein assumed to be manufactured through processing a material substrate which is so called a silicon-on-insulator (SOI) wafer, by a bulk micromachining technique such as a MEMS technique. The material substrate has a multilayer structure including a first and a second silicon layer, and an insulating layer provided between the silicon layers, which are given predetermined conductivity by doping an impurity. Whereas each of the foregoing portions constituting the micro-oscillation element X2 is formed based on at least one of the first silicon layer and the second silicon layer, the portions originating from the first silicon layer and located closer to the viewer than the insulating layer are hatched in FIG. 15, for the sake of explicitness of the drawing. In contrast, FIG. 16 depicts the portions of the micro-oscillation element X2 originating from the second silicon layer.

The micro-oscillation element X2 is different from the micro-oscillation element X1 according to the foregoing embodiment, in including the frame 21' instead of the frame 21, and in additionally including the frame 31, the pair of link portions 32A, 32B, the driving electrodes 33, 34, and the shield electrode portions 35, 36, 37. The oscillating portion 10, the pair of link portions 22, the driving electrode 23, and the shield electrode portion 24 in the micro-oscillation element X2 are similar to the oscillating portion 10, the pair of link portions 22, the driving electrode 23, and the shield electrode portion 24 in the micro-oscillation element X1.

Figure 17:
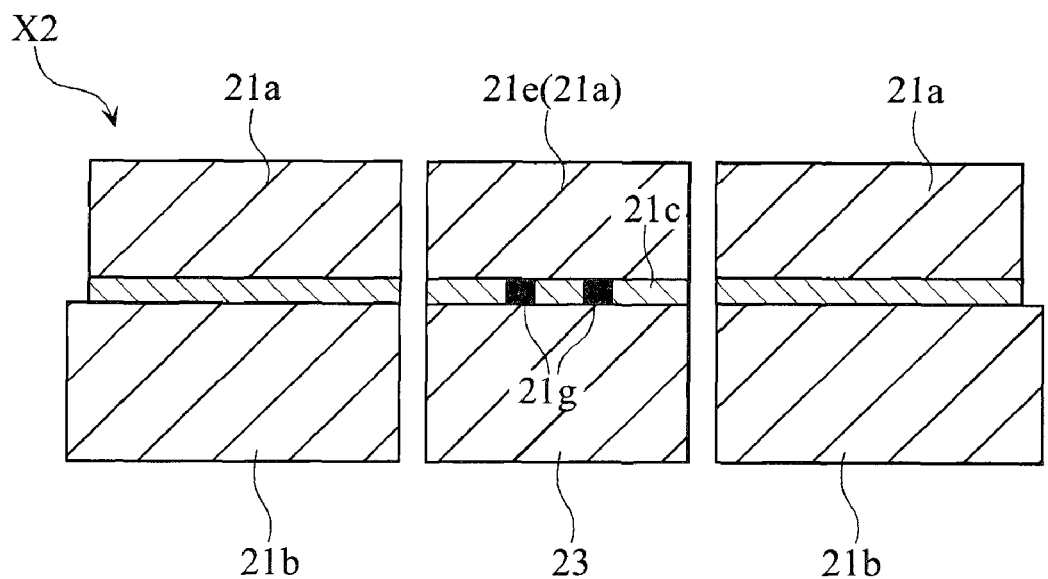
FIG. 17 is an enlarged cross-sectional view taken along a line XVII-XVII in FIG. 15.
Figure 20:
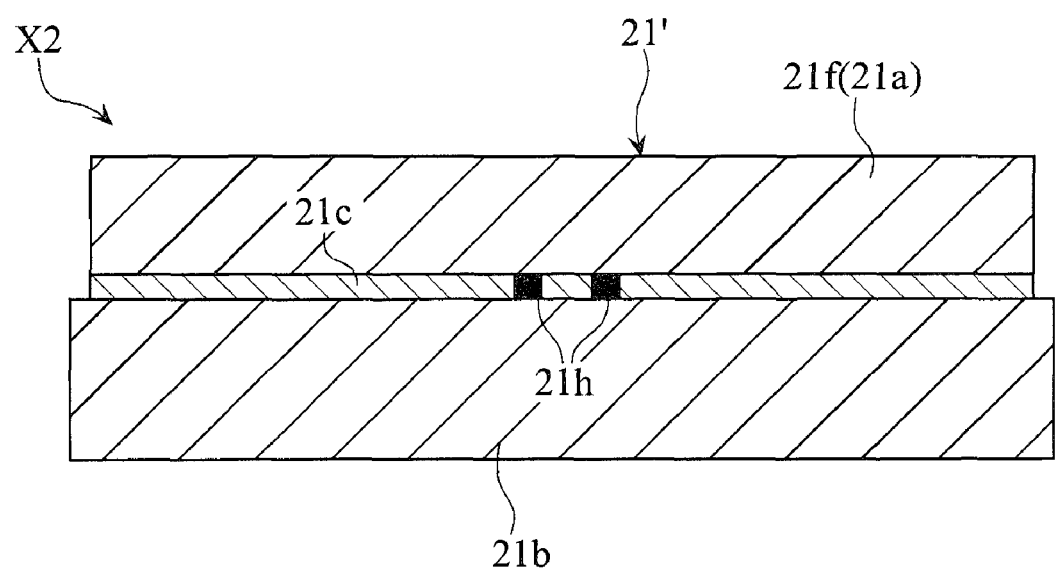
FIG. 20 is a cross-sectional view taken along a line XX-XX in FIG. 15.
Figure 21:
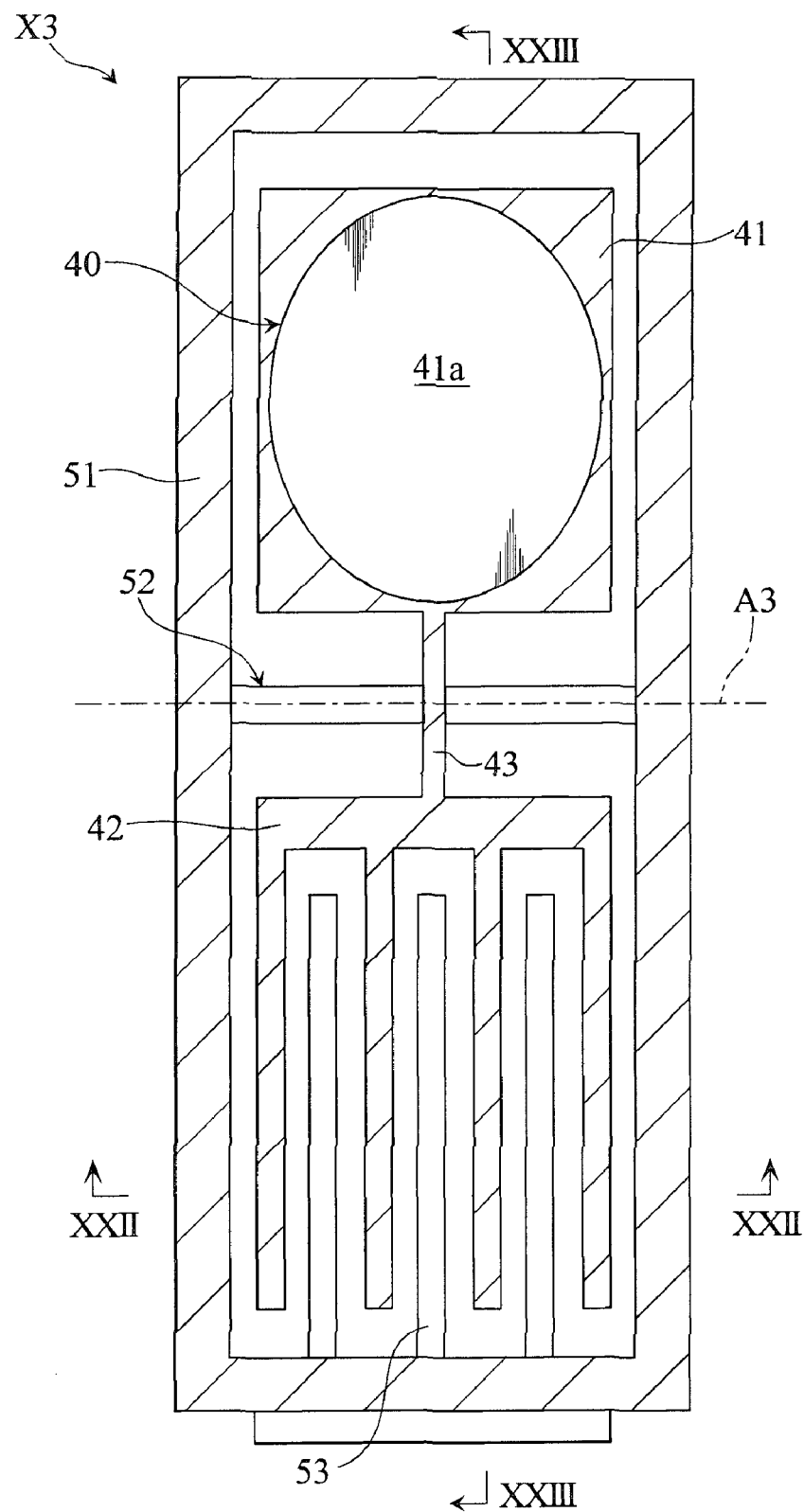
FIG. 21 is a plan view showing a conventional micro-oscillation element.
Figure 22:
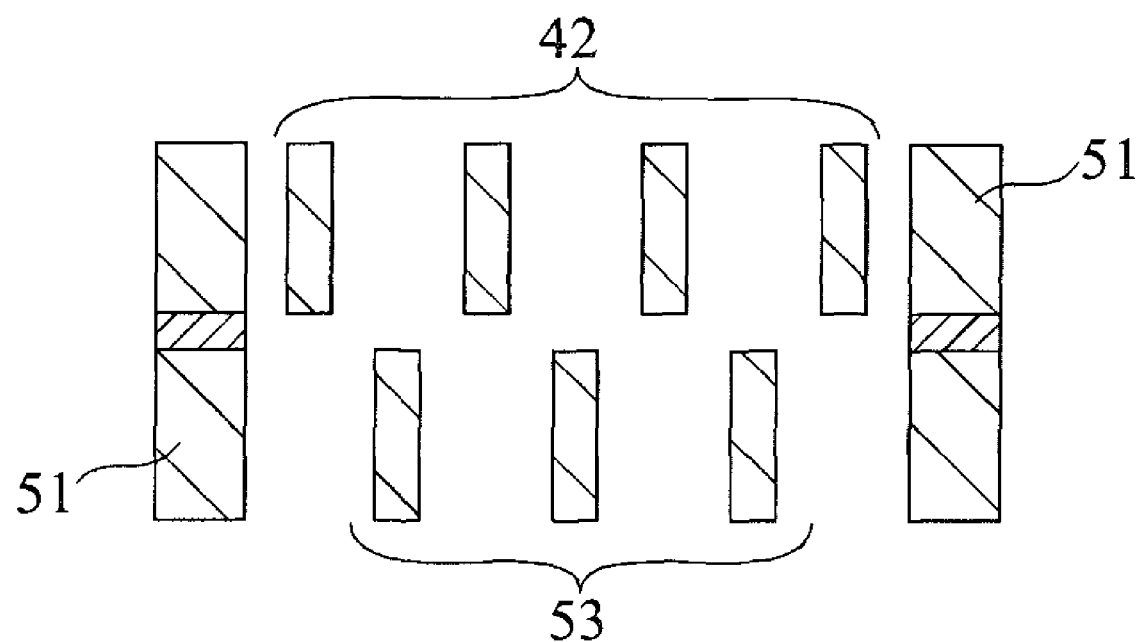
FIG. 22 is a cross-sectional view taken along a line XXII-XXII in FIG. 21.
Figure 23:
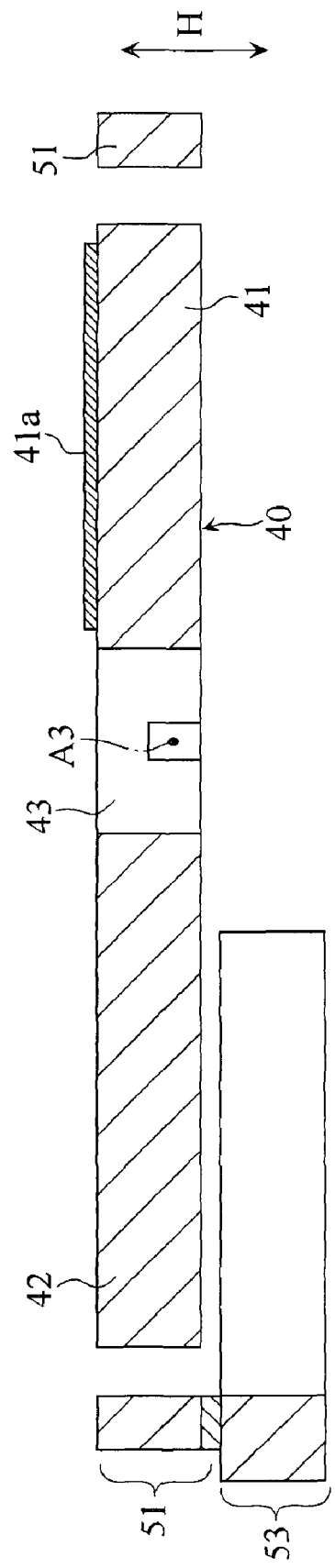
FIG. 23 is a cross-sectional view taken along a line XXIII-XXIII in FIG. 21.

The frame 21' is different from the frame 21 in that the first layered structure 21a includes portions 21e, 21f. The portion 21e is, as shown in FIGS. 15 and 17, isolated from surrounding portions in the first layered structure 21a via a gap. The portion 21e is electrically connected to the arm 23A of the driving electrode 23, through a conductive via 21g penetrating through the insulating layer 21c. The portion 21f is located at an end portion of the frame 21' as shown in FIG. 15, and includes a portion extending in the direction indicated by an arrow D in FIG. 15. As shown in FIG. 20, the portion 21f is electrically connected to the second layered structure 21b, through a conductive via 21h penetrating through the insulating layer 21c.

Figure 18:
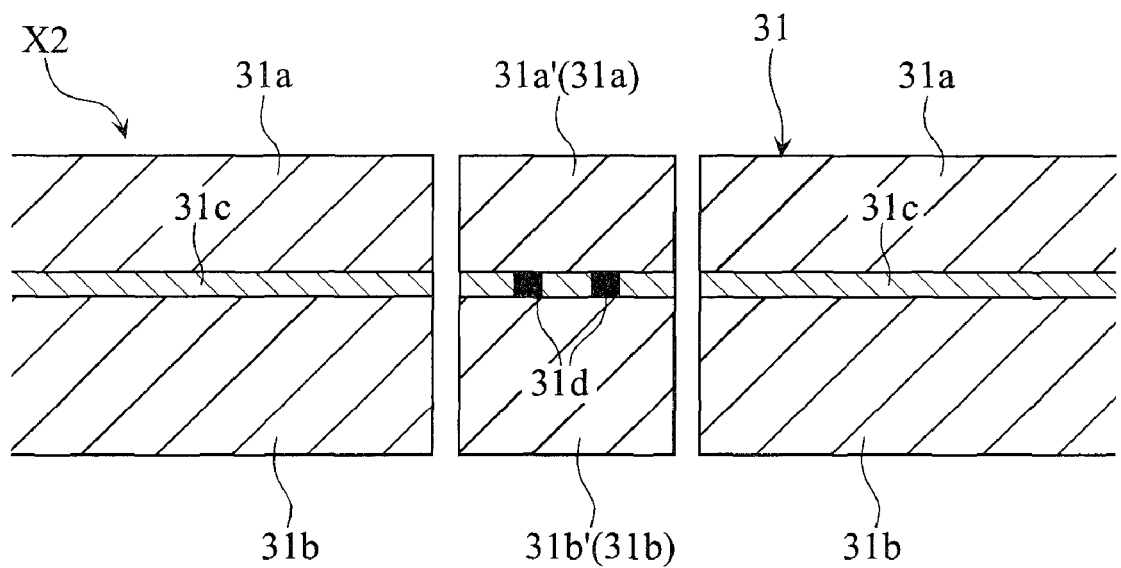
FIG. 18 is a cross-sectional view taken along a line XVII-XVII in FIG. 15.

The frame 31 has, as shown in FIG. 18, a multilayer structure including a first layered structure 31a originating from the first silicon layer, a second layered structure 31b originating from the second silicon layer, and an insulating layer 31c provided between the first and the second layered structure 31a, 31b. As shown in FIGS. 15 and 18, the first layered structure 31a includes a portion 31a' isolated from the surrounding portions via a gap. As shown in FIGS. 16 and 18, the second layered structure 31b includes a portion 31b' isolated from the surrounding portions via a gap. The portions 31a', 31b' are electrically connected through a conductive via 31d penetrating through the insulating layer 31c.

The link portion 32A includes a pair of torsion bars 32a as shown in FIG. 15. The torsion bars 32a originate from the first silicon layer, and are connected to the portion 21e of the first layered structure 21a of the frame 21' and the portion 31a' of the first layered structure 31a of the frame 31, to thereby connect the frames 21', 31. Through the torsion bars 32a, the portions 21e and 31a' are electrically connected. The spacing between the two torsion bars 32a gradually increases in a direction from the frame 31 toward the frame 21'. Also, the torsion bars 32a are thin, like the torsion bar 22a of the link portion 22 according to the foregoing embodiment.

The link portion 32B includes a pair of torsion bars 32b as shown in FIG. 15. The torsion bars 32b originate from the first silicon layer, and are connected to the portion 21f of the first layered structure 21a of the frame 21' and the first layered structure 31a of the frame 31, to thereby connect the frames 21', 31. Through the torsion bars 32b, the portions 21f and a part of the first layered structure 31a are electrically connected. The spacing between the two torsion bars 32b gradually increases in a direction from the frame 31 toward the frame 21'. Also, the torsion bars 32b are thin, like the torsion bar 22a of the link portion 22 according to the foregoing embodiment.

The pairs of link portions 32A, 32B define an axis A2 of the oscillating motion of the frame 21'. The axis A2 extends along the direction indicated by the arrow D in FIG. 15. The link portion 32A including two torsion bars 32a oriented such that the spacing therebetween gradually increases in a direction from the frame 31 toward the frame 21', and the link portion 32B including two torsion bars 32b oriented such that the spacing therebetween gradually increases in a direction from the frame 31 toward the frame 21' are appropriate for suppressing emergence of unnecessary displacement component in the oscillating motion of the frame 21'.

The driving electrode 33 originates from the first silicon layer, and includes a plurality of electrode teeth 33a. The plurality of electrode teeth 33a extends from the portion 21f of the frame 21' toward the driving electrode 34, and is spacedly aligned along the extending direction of the axis A2.

The driving electrode 34 originates from the second silicon layer, and includes an arm 34A and a plurality of electrode teeth 34a. The arm 34A extends parallel to the axis A2. The plurality of electrode teeth 34a extends from the arm 34A toward the driving electrode 33, and is spacedly aligned along the extending direction of the axis A2.

Figure 19:
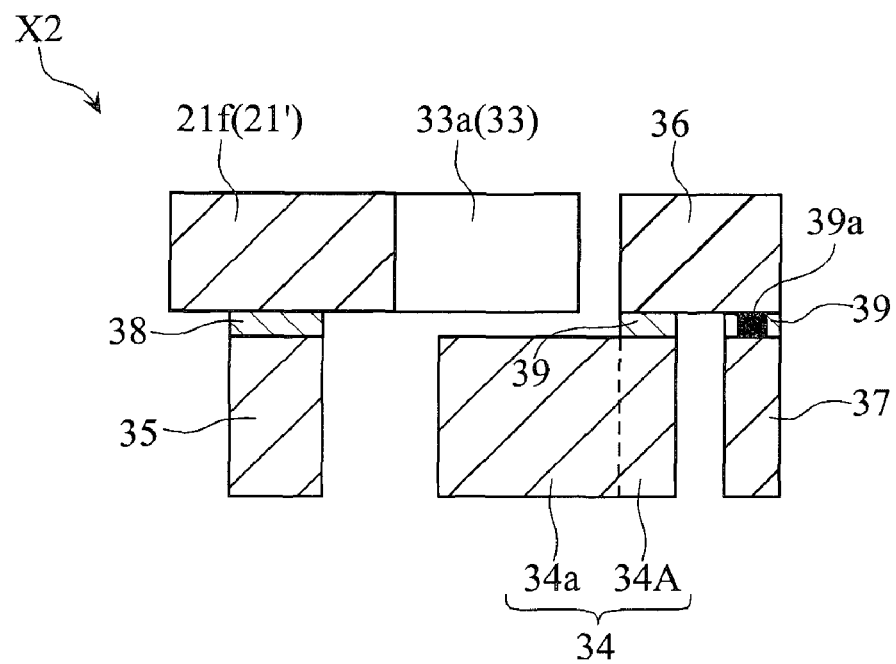
FIG. 19 is a cross-sectional view taken along a line XIX-XIX in FIG. 15.

The shield electrode portion 35 originates from the second silicon layer as is apparent from FIG. 16, and is an extension of the second layered structure 21b of the frame 21'. The shield electrode portion 35 is joined to the portion 21f of the frame 21' via an insulating layer 38, as shown in FIG. 19.

The shield electrode portion 36 originates from the first silicon layer as is apparent from FIG. 15, and is an extension of the first layered structure 31a of the frame 31. The shield electrode portion 36 is joined to the driving electrode 34 via an insulating layer 39, as shown in FIG. 19. The shield electrode portion 36 and the driving electrode 34 are electrically isolated from each other.

The shield electrode portion 37 originates from the second silicon layer as is apparent from FIG. 16, and extends along the driving electrode 34. The shield electrode portion 37 is joined to the shield electrode portion 36 via the insulating layer 39, and electrically connected through a conductive via 39a penetrating through the insulating layer 39, as shown in FIG. 19.

In the micro-oscillation element X2, the pair of driving electrodes 12, 23 constitutes a driving mechanism or an actuator that generates the driving force to be applied to the oscillating portion 10, and the pair of driving electrodes 33, 34 constitutes a driving mechanism or an actuator that generates the driving force to be applied to the frame 21'.

To drive the micro-oscillation element X2, the predetermined reference potential is applied to the driving electrode 12 and the driving electrode 33 of the oscillating portion 10. The reference potential can be applied to the driving electrode 12 via a part of the first layered structure 31a of the frame 31, the torsion bar 32b of the link portion 32B, the portion 21f of the first layered structure 21a of the frame 21', the conductive via 21h, the second layered structure 21b of the frame 21', the conductive via 21d (shown in FIG. 6), a part of the first layered structure 21a of the frame 21', the torsion bar 22a of the link portion 22, and the beam portion 13 of the oscillating portion 10. The reference potential can be applied to the driving electrode 33 via a part of the first layered structure 31a of the frame 31, the torsion bar 32b of the link portion 32B, and the portion 21f of the first layered structure 21a of the frame 21'. The reference potential is the ground potential for example, and preferably maintained at a constant level.

In the micro-oscillation element X2, upon applying a driving potential higher than the reference potential to each of the driving electrodes 23, 34 as required, static attraction is generated between the driving electrodes 12, 23 so as to cause the oscillating portion 10 to oscillate about the axis A1, as well as between the driving electrodes 33, 34 so as to cause the frame 21', and hence the oscillating portion 10 also, to oscillate about the axis A2. The micro-oscillation element X2 is what is known as a biaxial oscillation element. The driving potential can be applied to the driving electrode 23 via a portion 31b' of the second layered structure 31b of the frame 31, the conductive via 31d, a portion 31a' of the first layered structure 31a of the frame 31, the torsion bar 32a of the link portion 32A, the portion 21e of the first layered structure 21a of the frame 21', and the conductive via 21g. Driving biaxially the frame 21' and the oscillating portion 10 to oscillate as above allows changing as desired the direction of light reflected by the mirror portion 11a provided on the land portion 11.

The micro-oscillation element X2, substantially including the entire structure of the micro-oscillation element X1 according to the foregoing embodiment, enables controlling the amount of the rotational displacement in the oscillating motion of the oscillating portion 10 with high accuracy, as stated referring to the foregoing embodiment.

The micro-oscillation element X2, substantially including the entire structure of the micro-oscillation element X1 according to the foregoing embodiment, suppresses the field emitted from the driving electrode 23 upon driving the micro-oscillation element X2 from leaking out of the element, as stated referring to the foregoing embodiment.

The micro-oscillation element X2 also suppresses the field emitted from the driving electrode 34 upon driving the micro-oscillation element X2 from leaking out of the element. In the micro-oscillation element X2, the driving electrode 33 and the shield electrode portions 35, 36, 37 are electrically connected, so that the reference potential (for example, the ground potential) is applied to the driving electrode 33 as well as to the shield electrode portions 35, 36, 37 when the micro-oscillation element X2 is driven. Such configuration facilitates the driving electrode 33 and also the shield electrode portion 35 to absorb the electric field emitted from the driving electrode 34 toward the driving electrode 33 for example upon driving the micro-oscillation element X2, which originates from the predetermined driving potential higher than the reference potential. In other words, such electric field barely leaks out beyond the driving electrode 33 and the shield electrode portion 35. Also, the electric field emitted from the driving electrode 34 toward the opposite side of the driving electrode 33 upon driving the micro-oscillation element X2 tends to be absorbed by the shield electrode portions 36, 37. In other words, such electric field barely leaks out of the element beyond the shield electrode portions 36, 37. Such field absorption effects also contribute to suppressing the electric field from leaking out of the element.

The micro-oscillation element array Y2 includes a plurality of micro-oscillation elements X2 thus configured. In the micro-oscillation element array Y2, the plurality of micro-oscillation elements X2 is aligned in a row, such that all the axes A2 (not shown in FIG. 14) become parallel to each other.

In the micro-oscillation element array Y2, the first layered structure 31a of the frame 31 is continuous throughout all the micro-oscillation elements X2 except for the respective portions 31a', and hence the driving electrode 12, the weight portion 14C of the oscillating portion 10, a part of the first layered structure 21a and of the second layered structure 21b of the frame 21, and the shield electrode portion 24 of all the micro-oscillation elements X2 are electrically connected.

To drive the micro-oscillation element array Y2, the predetermined driving potential is applied to the driving electrodes 23, 34 of a selected micro-oscillation element X2, with the predetermined reference potential being applied in common to the driving electrode 12 in the oscillating portion 10 of all the micro-oscillation elements X2. Accordingly, the oscillating portion 10 and the frame 21' of the respective micro-oscillation element X2 are individually driven to oscillate, so as to change the direction of light reflected by the mirror portion 11a provided on the land portion 11 of the respective micro-oscillation element X2, as desired.

Each of the micro-oscillation elements X2 suppresses, as already stated, the field emitted from the driving electrode 23 upon driving the micro-oscillation element X2 from leaking out of the element. In the micro-oscillation element array Y2, therefore, there is little likelihood that the field leak from the driving mechanism (driving electrodes 12, 23) of one of the micro-oscillation elements X2 unduly affects the driving characteristic of the adjacent micro-oscillation element X2. Each micro-oscillation element X2 also suppresses, as already stated, the field emitted from the driving electrode 34 upon driving the micro-oscillation element X2 from leaking out of the element. In the micro-oscillation element array Y2, therefore, there is little likelihood that the field leak from the driving mechanism (driving electrodes 33, 34) of one of the micro-oscillation elements X2 unduly affects the driving characteristic of the adjacent micro-oscillation element X2. The micro-oscillation element array Y2 thus configured is advantageous for achieving a narrower alignment pitch of the plurality of biaxial micro-oscillation elements X2, hence the plurality of mirror portions 11a. Thus, the micro-oscillation element array Y2 is appropriate for achieving higher density of the micro-oscillation elements X2, or the mirror portions 11a.

The invention claimed is:

1. A micro-oscillation element, comprising:
a base frame;
an oscillating portion including a movable functional portion, a first driving electrode connected to the movable functional portion, and a weight portion joined to an end of the first driving electrode on an opposite side of the movable functional portion;
a link portion connecting the base frame and the oscillating portion to each other and defining an axis of an oscillating motion of the oscillating portion; and
a second driving electrode that generates driving force for the oscillating motion in cooperation with the first driving electrode, the second driving electrode being fixed to the base frame;
wherein the weight portion is wider than the end of the first driving electrode, as viewed in a direction in which the axis of the oscillating motion extends,
wherein the weight portion is electrically connected to the first driving electrode,
wherein electrostatic force is generated between the weight portion and the second driving electrode, and
wherein a spacing between the weight portion and the second driving electrode gradually increases as proceeding away from the first driving electrode.

2. The micro-oscillation element according to claim 1, wherein the micro-oscillation element is obtained by processing a material substrate having a multilayer structure including a first conductor layer, a second conductor layer and an insulating layer between the first and the second conductor layers, and wherein the movable functional portion, the first driving electrode and the weight portion are portions formed in the first conductor layer, and the second driving electrode is a portion formed in the second conductor layer.

3. The micro-oscillation element according to claim 1, wherein the link portion is connected to the oscillating portion at a position between the movable functional portion and the first driving electrode.

4. The micro-oscillation element according to claim 1, wherein the first driving electrode includes: a first arm portion and a second arm portion extending in parallel in a direction intersecting with the axis; a plurality of electrode teeth extending from the first arm portion toward the second arm portion and spacedly aligned along the extending direction of the first arm portion; and a plurality of electrode teeth extending from the second arm portion toward the first arm portion and spacedly aligned along the extending direction of the second arm portion; and
wherein the second driving electrode includes: a third arm portion extending along the first and the second arm portions; a plurality of electrode teeth extending from the third arm portion toward the first arm portion and spacedly aligned along the extending direction of the third arm portion; and a plurality of electrode teeth extending from the third arm portion toward the second arm portion and spacedly aligned along the extending direction of the third arm portion.

5. The micro-oscillation element according to claim 1, wherein the oscillating portion further includes an additional weight portion connected to the first driving electrode at a position between the movable functional portion and the weight portion.

6. The micro-oscillation element according to claim 5, wherein micro-oscillation element is obtained by processing a material substrate having a multilayer structure including a first conductor layer, a second conductor layer and an insulating layer between the first and the second conductor layer, wherein the movable functional portion, the first driving electrode and the weight portion are portions formed in the first conductor layer, and the second driving electrode and the additional weight portion are portions formed in the second conductor layer.

7. The micro-oscillation element according to claim 5, wherein the additional weight portion is electrically connected to the first driving electrode.

8. The micro-oscillation element according to claim 1, further comprising:
an additional frame;
an additional link portion connecting the base frame and the additional frame to each other and defining an additional axis extending in a direction intersecting with the axis of an oscillating motion of the base frame; and
a driving mechanism that generates driving force causing the base frame to oscillate.

9. A micro-oscillation element array, comprising a plurality of micro-oscillation elements according to claim 1.

10. The micro-oscillation element array according to claim 9, wherein the axes of the respective micro-oscillation elements are parallel to each other.

11. The micro-oscillation element array according to claim 9, wherein the first driving electrodes of the respective micro-oscillation elements can accept a potential given in common, and the second driving electrodes of the respective micro-oscillation elements can accept a potential individually given thereto.

* * * * *